United States Patent
Wan et al.

(10) Patent No.: US 7,629,267 B2
(45) Date of Patent: Dec. 8, 2009

(54) HIGH STRESS NITRIDE FILM AND METHOD FOR FORMATION THEREOF

(75) Inventors: Yuet Mei Wan, Mount Waverley (AU); René de Blank, Heverlee (BE); Jan Willem Maes, Wilrijk (BE)

(73) Assignee: ASM International N.V. (NL)

( * ) Notice: Subject to any disclaimer, the term of this patent is extended or adjusted under 35 U.S.C. 154(b) by 298 days.

(21) Appl. No.: 11/370,228

(22) Filed: Mar. 6, 2006

(65) Prior Publication Data

US 2006/0199357 A1 Sep. 7, 2006

Related U.S. Application Data

(60) Provisional application No. 60/659,454, filed on Mar. 7, 2005.

(51) Int. Cl.
H01L 21/31 (2006.01)
H01L 21/469 (2006.01)

(52) U.S. Cl. .................. 438/758; 257/E21.247

(58) Field of Classification Search .................. 257/52; 438/758

See application file for complete search history.

(56) References Cited

U.S. PATENT DOCUMENTS

| | | | |
|---|---|---|---|
| 4,188,444 A | 2/1980 | Landau | |
| 4,262,631 A | 4/1981 | Kubacki | |
| 4,277,320 A | 7/1981 | Beguwala et al. | |
| 4,298,629 A | 11/1981 | Nozaki et al. | |
| 4,363,828 A | 12/1982 | Brodsky et al. | |
| 4,495,218 A | 1/1985 | Azuma et al. | |
| 4,585,671 A | 4/1986 | Kitagawa et al. | |
| 4,610,859 A | 9/1986 | Miyagawa et al. | |
| 4,684,542 A | 8/1987 | Jasinski et al. | |
| 4,715,937 A | 12/1987 | Moslehi et al. | |
| 4,720,395 A | 1/1988 | Foster | |
| 4,828,224 A | 5/1989 | Crabb et al. | |
| 4,834,020 A | 5/1989 | Bartholomew | |

(Continued)

FOREIGN PATENT DOCUMENTS

EP 0 368 651 A2 5/1990

(Continued)

OTHER PUBLICATIONS

Ikoma et al., Growth of Si/3C-SiC/Si(100) hetrostructures by pulsed supersonic free jets, Applied Physics Letters, vol. 75, No. 25, pp. 3977-3979, Dec. 1999.

(Continued)

*Primary Examiner*—Kiesha L. Rose
*Assistant Examiner*—Igwe U Anya
(74) *Attorney, Agent, or Firm*—Knobbe, Martens, Olson & Bear LLP

(57) ABSTRACT

A silicon nitride film is formed on a substrate in a reaction chamber by introducing trisilane and a reactive nitrogen species into the chamber in separate pulses. A carbon precursor gas is also flowed into the chamber during introduction of the trisilane and/or during introduction of the reactive nitrogen species, or in pulses separate from the trisilane and reactive nitrogen species pulses. The carbon is used as a dopant in the silicon nitride film and advantageously allows a high stress silicon nitride film to be formed.

14 Claims, 13 Drawing Sheets

U.S. PATENT DOCUMENTS

| | | | |
|---|---|---|---|
| 4,851,095 A | 7/1989 | Scobey et al. | |
| 4,855,254 A | 8/1989 | Eshita et al. | |
| 4,891,103 A | 1/1990 | Zorinsky et al. | |
| 5,111,266 A | 5/1992 | Furumura et al. | |
| 5,214,002 A | 5/1993 | Hayashi et al. | |
| 5,221,556 A | 6/1993 | Hawkins et al. | |
| 5,227,329 A | 7/1993 | Kobayashi et al. | |
| 5,287,205 A | 2/1994 | Yamazaki et al. | |
| 5,356,673 A | 10/1994 | Schmitt et al. | |
| 5,356,821 A | 10/1994 | Naruse et al. | |
| 5,389,398 A | 2/1995 | Suzuki et al. | |
| 5,389,570 A | 2/1995 | Shiozawa | |
| 5,453,858 A | 9/1995 | Yamazaki | |
| 5,471,330 A | 11/1995 | Sarma | |
| 5,591,494 A | 1/1997 | Sato et al. | |
| 5,607,724 A | 3/1997 | Beinglass et al. | |
| 5,614,257 A | 3/1997 | Beinglass et al. | |
| 5,648,293 A | 7/1997 | Hayama et al. | |
| 5,656,531 A | 8/1997 | Thakur et al. | |
| 5,695,819 A | 12/1997 | Beinglass et al. | |
| 5,698,771 A | 12/1997 | Shields et al. | |
| 5,700,520 A | 12/1997 | Beinglass et al. | |
| 5,786,027 A | 7/1998 | Rolfson | |
| 5,789,030 A | 8/1998 | Rolfson | |
| 5,837,580 A | 11/1998 | Thakur et al. | |
| 5,849,601 A | 12/1998 | Yamazaki | |
| 5,874,129 A | 2/1999 | Beinglass et al. | |
| 5,876,797 A | 3/1999 | Beinglass et al. | |
| 5,885,869 A | 3/1999 | Turner et al. | |
| 5,907,792 A | 5/1999 | Droopad et al. | |
| 5,916,365 A | 6/1999 | Sherman | |
| 5,959,326 A | 9/1999 | Aiso et al. | |
| 6,015,590 A | 1/2000 | Suntola et al. | |
| 6,027,705 A | 2/2000 | Kitsuno et al. | |
| 6,056,823 A | 5/2000 | Sajoto et al. | |
| 6,083,810 A | 7/2000 | Obeng et al. | |
| 6,087,229 A | 7/2000 | Aronoqitz et al. | |
| 6,103,600 A | 8/2000 | Ueda et al. | |
| 6,136,654 A | 10/2000 | Kraft et al. | |
| 6,159,828 A | 12/2000 | Ping et al. | |
| 6,161,498 A | 12/2000 | Toraguchi et al. | |
| 6,171,662 B1 | 1/2001 | Nakao | |
| 6,197,669 B1 | 3/2001 | Twu et al. | |
| 6,197,694 B1 | 3/2001 | Beinglass | |
| 6,200,893 B1 | 3/2001 | Sneh | |
| 6,207,585 B1* | 3/2001 | Hasegawa et al. | 438/763 |
| 6,228,181 B1 | 5/2001 | Yamamoto et al. | |
| 6,252,295 B1 | 6/2001 | Cote et al. | |
| 6,271,054 B1 | 8/2001 | Ballantine et al. | |
| 6,294,399 B1 | 9/2001 | Fukumi et al. | |
| 6,326,311 B1 | 12/2001 | Ueda et al. | |
| 6,373,112 B1 | 4/2002 | Murthy et al. | |
| 6,385,020 B1 | 5/2002 | Shin et al. | |
| 6,391,803 B1 | 5/2002 | Kim et al. | |
| 6,455,892 B1 | 9/2002 | Okuno et al. | |
| 6,468,924 B2 | 10/2002 | Lee et al. | |
| 6,503,846 B1 | 1/2003 | Niimi et al. | |
| 6,528,530 B2 | 3/2003 | Zeitlin et al. | |
| 6,537,910 B1 | 3/2003 | Burke et al. | |
| 6,551,893 B1 | 4/2003 | Zheng et al. | |
| 6,589,868 B2 | 7/2003 | Rossman | |
| 6,613,695 B2 | 9/2003 | Pomarede et al. | |
| 6,638,879 B2 | 10/2003 | Hsieh et al. | |
| 6,821,825 B2 | 11/2004 | Todd et al. | |
| 6,824,816 B2 | 11/2004 | Aaltonen et al. | |
| 6,962,859 B2 | 11/2005 | Todd et al. | |
| 7,005,392 B2 | 2/2006 | Baum et al. | |
| 7,125,582 B2 | 10/2006 | McSwiney et al. | |
| 7,172,792 B2 | 2/2007 | Wang et al. | |
| 7,192,626 B2 | 3/2007 | Dussarrat et al. | |
| 2001/0032986 A1 | 10/2001 | Miyasaka | |
| 2002/0047151 A1 | 4/2002 | Kim et al. | |
| 2002/0073925 A1 | 6/2002 | Noble et al. | |
| 2002/0098627 A1 | 7/2002 | Pomarede et al. | |
| 2002/0160605 A1 | 10/2002 | Kanzawa et al. | |
| 2002/0168868 A1 | 11/2002 | Todd | |
| 2002/0197831 A1* | 12/2002 | Todd et al. | 438/528 |
| 2003/0022528 A1 | 1/2003 | Todd | |
| 2003/0059535 A1 | 3/2003 | Luo et al. | |
| 2003/0082300 A1* | 5/2003 | Todd et al. | 427/255.27 |
| 2004/0096582 A1 | 5/2004 | Wang et al. | |
| 2005/0064684 A1 | 3/2005 | Todd et al. | |
| 2005/0079692 A1 | 4/2005 | Samoilov et al. | |
| 2005/0080286 A1 | 4/2005 | Wang et al. | |
| 2005/0118837 A1* | 6/2005 | Todd et al. | 438/791 |
| 2005/0184397 A1* | 8/2005 | Gates et al. | 257/774 |
| 2005/0247986 A1* | 11/2005 | Ko et al. | 257/411 |
| 2005/0250302 A1 | 11/2005 | Todd et al. | |
| 2006/0019032 A1* | 1/2006 | Wang et al. | 427/248.1 |
| 2006/0084283 A1 | 4/2006 | Paranjpe et al. | |
| 2006/0088985 A1 | 4/2006 | Haverkort et al. | |
| 2006/0172556 A1* | 8/2006 | Bather et al. | 438/794 |

FOREIGN PATENT DOCUMENTS

| | | |
|---|---|---|
| EP | 0 486 047 A2 | 5/1992 |
| EP | 0 747 974 A2 | 12/1996 |
| EP | 1 065 728 A2 | 1/2001 |
| GB | 2 298 313 A | 8/1996 |
| GB | 2 332 564 A | 6/1999 |
| JP | 57209810 | 12/1982 |
| JP | 59078918 | 5/1984 |
| JP | 59078919 | 5/1984 |
| JP | 60043485 | 3/1985 |
| JP | 60043485 A | 3/1985 |
| JP | 61-095535 | 5/1986 |
| JP | 61153277 | 7/1986 |
| JP | 62076612 | 4/1987 |
| JP | 63003414 | 1/1988 |
| JP | 63003463 | 1/1988 |
| JP | 01-179710 | 7/1989 |
| JP | 1217956 | 8/1989 |
| JP | 1268064 | 10/1989 |
| JP | 2155225 | 6/1990 |
| JP | 03-091239 | 4/1991 |
| JP | 3091239 | 4/1991 |
| JP | 3185817 | 8/1991 |
| JP | 3187215 | 8/1991 |
| JP | 3292741 | 12/1991 |
| JP | 4323834 | 11/1992 |
| JP | 5021378 | 1/1993 |
| JP | 05-062811 | 3/1993 |
| JP | 05-062911 | 3/1993 |
| JP | 5062911 | 3/1993 |
| JP | 7249618 | 9/1995 |
| JP | 8242006 | 9/1996 |
| JP | 11317530 | 11/1999 |
| JP | 2000-100811 | 4/2000 |
| WO | WO 02/43115 A2 | 5/2002 |
| WO | WO 02/064853 A2 | 8/2002 |
| WO | WO 2004/009861 A2 | 1/2004 |
| WO | WO 2004009861 A2 * | 1/2004 |

OTHER PUBLICATIONS

International Search Report dated Nov. 13, 2003 for international patent application No. PCTUS02/02921, filed on Feb. 1, 2002.

Iyer, R. Suryanarayanan et al., "A process Method of Silicon Nitride Atomic layer Cyclic deposition," Semicon Taiwan 2001, pp. 17-25.

Olivares, J. et al., "Solid-phase crystallization of amorphouse SiGe films deposed by LPCVD on SiOs and glass," Thin Solid Films 337 (1999), pp. 51-54.

Sze, VLSI Technology, "Arrhenius plot for polysilicon deposition for different silane partial pressures," (1988) pp. 240-241.

International Search Report and Written Opinion for International Application No. PCT/US2006/047805. May 8, 2007.

Ishihara et al., "Low-temperature chemical-vapor-deposition of silicon-nitride from tetra-silane and hydrogen azide," *Materials Research Society Symposium Proceedings*, vol. 284, p. 3-8 (1993).

Kanoh et al., "Low-temperature chemical-vapor-deposition of silicon nitride," *Journal de Physique IV*, vol. 2, p. C2-831-C2-837 (1991).

Yeh et al., "Low-temperature chemical-vapor-deposition of silicon-nitride film from hexachloro-disilane and hydrazine," *Jpn. J. Appl. Phys.* vol. 35, Part 1, No. 2B, p. 1509-1512 (Feb. 1996).

* cited by examiner

HIGH STRESS NITRIDE FILM AND METHOD FOR FORMATION THEREOF

REFERENCE TO RELATED APPLICATIONS

This application claims the priority benefit under 35 U.S.C. § 119(e) of U.S. Provisional Application 60/659,454, filed Mar. 7, 2005.

In addition, this application is related to: U.S. Patent Application No. 60/605,068, STOICHIOMETRIC SILICON COMPOUNDS DEPOSITION IN BATCH FURNACES, filed Aug. 27, 2004; U.S. patent application Ser. No. 10/623,482, METHOD TO FORM ULTRA HIGH QUALITY SILICON-CONTAINING LAYERS, filed Jul. 18, 2003, which claims the priority benefit of U.S. Provisional Application No. 60/397,576, METHOD TO FORM ULTRA HIGH QUALITY SILICON-CONTAINING LAYERS, filed Jul. 19, 2002; U.S. patent application Ser. No. 10/074,564, THIN FILMS AND METHODS OF MAKING THEM, filed Feb. 11, 2002; and U.S. patent application Ser. No. 10/074,563, IMPROVED PROCESS FOR DEPOSITION OF SEMICONDUCTOR FILMS, filed Feb. 11, 2002. The disclosure of each of these references is incorporated herein by reference in its entirety.

BACKGROUND OF THE INVENTION

1. Field of the Invention

This invention relates generally to forming silicon-containing layers during integrated circuit fabrication and, more particularly, to methods for forming silicon-containing layers with increased tensile stress.

2. Description of the Related Art

As the dimensions of microelectronic devices become smaller, the physical characteristics of the deposited layers, including uniformity in thickness, composition, and coverage, become more important. This is particularly true of the layers, or films, of silicon compounds that can act as dielectrics or insulators to separate conductive elements of an integrated circuit. For example, silicon nitride materials are widely used in the semiconductor industry as transistor gate dielectrics, insulators between metal levels, barriers to prevent oxidation and other diffusion, hard masks, passivation layers, spacer materials in transistors, anti-reflective coating materials, layers in non-volatile memories, etc. Silicon oxide and silicon carbide materials are similarly common in integrated circuit fabrication.

Currently, chemical vapor deposition (CVD) is the most commonly used process for deposition of thin layers on a substrate. With this process, precursors for molecules or atoms that will ultimately form the deposited layer are fed simultaneously into a reaction chamber as molecular precursors. The substrate is kept at a temperature that is optimized to promote chemical reaction between the molecular precursors so that a layer of the desired atomic or molecular species is deposited on the substrate. The most common molecular precursor for forming silicon-containing thin layers by conventional CVD has been silane.

CVD has proven to have a superior ability to deposit layers with relatively uniform thicknesses. In addition, it produces relatively conformal layers, i.e., layers that closely replicate the shape of the surface on which they are being deposited. However, as device density continues to increase and geometries continue to become more complicated, deposition processes have been further refined to meet the need for even more uniform and conformal layers.

For these reasons, atomic layer deposition (ALD) has become more prominent in semiconductor fabrication. ALD typically involves multiple deposition cycles, with each cycle depositing a thin layer. ALD seeks to deposit perfectly conformal and uniform layers by depositing no more than a single monolayer during each cycle. Typically, this is accomplished by use of a self-terminating precursor molecule and optimizing conditions to avoid condensation and thermal decomposition of the precursors. For example, to deposit a layer of a titanium compound, a titanium precursor molecule such as $TiCl_4$ can be used. With $TiCl_4$, the titanium atom attaches to the surface of the substrate while chlorine atoms terminate the adsorbed layer on the side of the titanium atom opposite the substrate surface. As a result, once the substrate surface is covered with a monolayer of the titanium molecule, the top of the titanium layer will comprise chlorine atoms which are relatively inert and cause the adsorption process to self-terminate.

In contrast to CVD, ALD molecular precursors used to produce a compound layer, i.e., a layer comprising two or more elements, are typically introduced into the ALD reactor in separate pulses. For example, a first precursor self-limitingly adsorbs on the substrate in a first pulse, with ligands of the adsorbed species preventing further adsorption. Between introduction of precursors, the reaction chamber is evacuated or purged with inert gas to prevent gas phase reactions between the different precursors. After purging of the first precursor, a second precursor can be introduced into the reaction chamber to react with the layer deposited by introduction of the first precursor, e.g., to strip the ligands or to replace the ligands. In this way, one cycle is completed and one thin compound layer is deposited on a substrate. After reaction with the second precursor, the second precursor (and any byproduct) can be removed by evacuation or inert gas purging. In addition to these precursors, other reactants can also be pulsed into the reaction chamber during each cycle. The cycle can then be repeated until a compound layer of a desired thickness is reached.

While ALD gives superior conformality and uniformity in comparison to CVD, ALD is relatively inefficient in terms of speed. Because a layer of a desired thickness must, in theory, be formed one molecular monolayer at a time (in actuality, less than one molecular monolayer is typical, due to the blocking of reactive sites as a result of steric hindrance), and because multiple steps must be employed to form each monolayer, ALD forms a layer with a given thickness more slowly than does CVD. Consequently, while conformality and uniformity is increased, ALD has the drawback of having decreased throughput in comparison to CVD.

Nevertheless, high conformality and uniformity are important considerations as semiconductor fabrication currently involves depositing silicon-containing compound films during the process of making thousands or even millions of devices simultaneously on a substrate that is 200 millimeters (mm) in diameter. Moreover, the industry is transitioning to 300 mm wafers, and can use even larger wafers in the future. In addition, even larger substrates, in the form of flat panel displays, etc., are becoming increasingly common. Significant variations in the thickness and/or composition of the silicon-containing compound films during the manufacturing process can lead to lower manufacturing yields when the affected devices do not meet the required performance specifications. Also, variations across the film within a particular device can reduce device performance and/or reliability.

Thus, as substrate sizes increase to accommodate manufacture of larger numbers of microelectronic devices on a circuit, the problems created by the shortcomings of conventional CVD processes also increase.

In addition, when silicon-containing compound films, such as silicon nitride films, are used to form liners for electrical devices such as transistors, high stress is desirable to enhance carrier mobility in the transistor channel. A common technique for forming such silicon nitride films is low pressure CVD (LPCVD). Films formed by such a process, however, result in films with relatively low tensile stress.

Consequently, there is a need for methods for forming high quality silicon-containing compound films, such as silicon nitride films, with high stress.

SUMMARY OF THE INVENTION

According to one aspect of the invention, a method is provided for forming a silicon-containing compound layer. The method comprises loading a substrate into a reactor and depositing a silicon layer on the substrate by exposing the substrate to a flow of trisilane. The flow of trisilane is interrupted and a silicon compound layer is formed by exposing the silicon layer to a reactive nitrogen species while the flow is interrupted. The substrate is also exposed to a flow of a dopant precursor.

According to another aspect of the invention, an integrated circuit is provided. The integrated circuit comprises a film silicon nitride comprising a dopant. The tensile stress of the film is about 2 GPa or greater.

According to yet another aspect of the invention, a method is provided for semiconductor processing. The method comprises repeatedly separately exposing a substrate to a silane and a first reactive species to form a silicon-containing film. The tensile stress of the silicon-containing film is increased by exposing the substrate to a second reactive species.

BRIEF DESCRIPTION OF THE DRAWINGS

The invention will be better understood from the detailed description of the preferred embodiments and from the appended drawings, which are meant to illustrate and not to limit the invention, wherein like numerals refer to like structures throughout and wherein.

DETAILED DESCRIPTION OF THE PREFERRED EMBODIMENT

Stoichiometric silicon nitride liner layers can be formed by LPCVD using dichlorosilane or trisilane. These layers typically have a maximum tensile stress of about 1.1 GPa. A high stress layer of about 2 GPa or higher, however, is preferred for modern silicon nitride liner layers.

Plasma-enhanced CVD (PECVD) can be used to form a high stress silicon nitride layer. Besides the power of the plasma source and the pressure of the PECVD process, the temperatures of post-processing, implantation and etch conditions can be manipulated to control the intrinsic stress of the nitride layer. It is easier, however, to obtain high compressive stress with PECVD than high tensile stress.

Advantageously, it has been found that the tensile stress of a silicon nitride layer can be increased by adding a dopant, e.g., carbon, to the layer. In preferred embodiments of the invention, a silicon-containing layer, e.g., a silicon nitride layer, is formed by exposing a substrate to a silane and to a first reactive species, e.g., a nitrogen-containing precursor, in separate pulses. The silane is preferably trisilane. Other examples of silanes include monosilane, disilane, dichlorosilane and trichlorosilane. The substrate is also exposed to a dopant precursor, e.g., a carbon-containing precursor. The substrate can be exposed to the dopant precursor concurrently with exposure of the substrate to the silane and/or concurrently with exposure of the substrate to the first reactive species or in pulse(s) separate from exposure of the substrate to the silane or the first reactive species. Advantageously, addition of the dopant increases the tensile stress of the silicon-containing films, thereby forming films having a tensile stress of about 2 GPa or higher.

Reference will now be made to the FIGURES, in which like numerals refer to like parts throughout.

Single Wafer Reactor

Use of a single-substrate, horizontal flow cold-wall reactor has particular advantages. For example, the illustrated single-pass horizontal flow design enables laminar flow of reactant gases, with low residence times, which in turn facilitates rapid sequential processing, particularly in the cyclical deposition process described below, while minimizing reactant interaction with each other and with chamber surfaces. Such a laminar flow enables sequentially flowing reactants that might react with each other. Reactions to be avoided include highly exothermic or explosive reactions, such as produced by oxygen and hydrogen-bearing reactants, and reactions that produce particulate contamination of the chamber. The skilled artisan will recognize, however, that for certain sequential processes, other reactor designs can also be provided for achieving these ends, provided sufficient purge or evacuation times are allowed to remove incompatible reactants.

Figure 1:
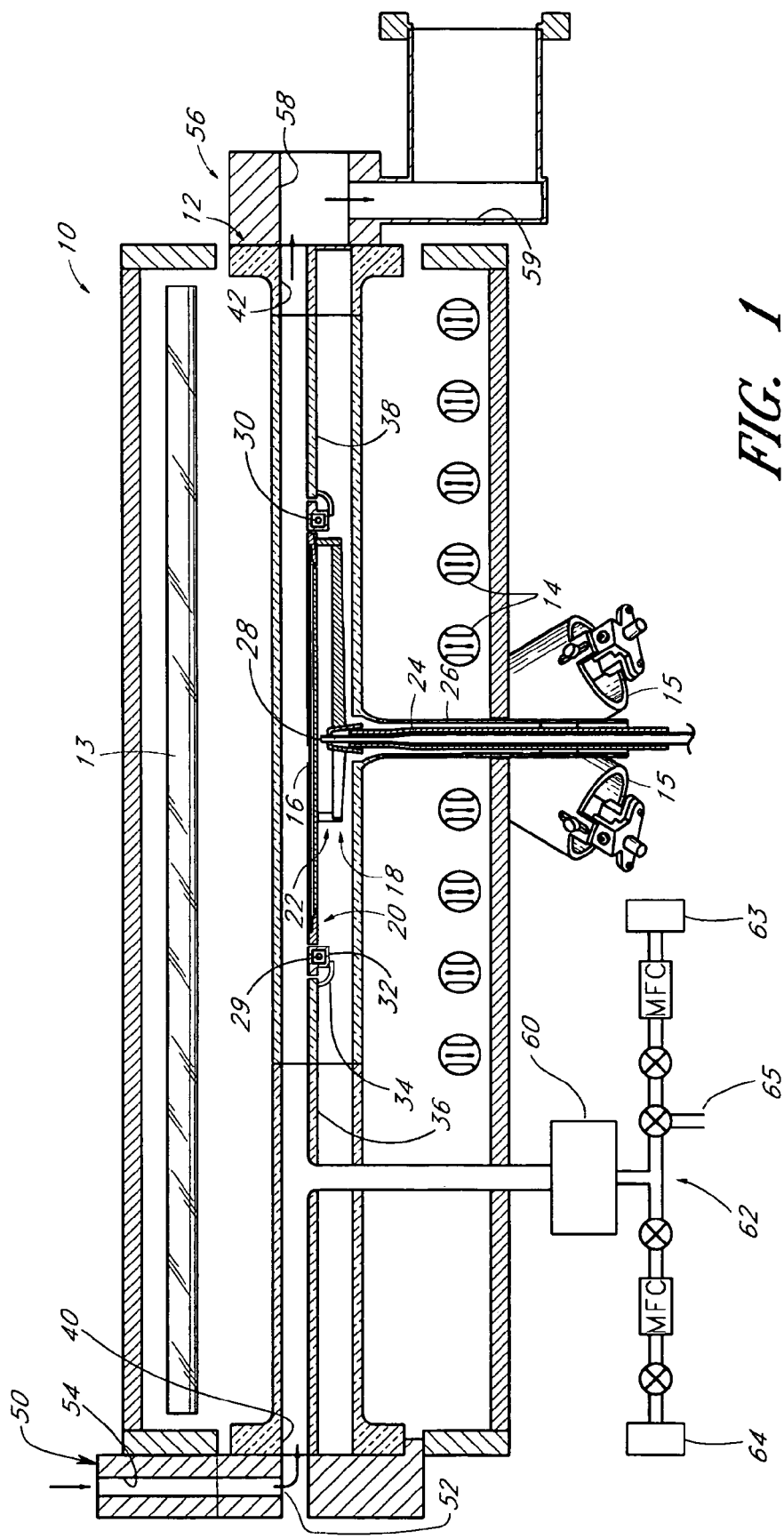
FIG. 1 is a schematic sectional view of an exemplary single-substrate reaction chamber for use with preferred embodiments of the invention.

FIG. 1 shows a chemical vapor deposition (CVD) reactor 10, including a quartz process or reaction chamber 12, constructed in accordance with a preferred embodiment, and for which the methods disclosed herein have particular utility.

The superior processing control of the reactor 10 has utility in CVD of a number of different materials and can safely and cleanly accomplish multiple treatment steps sequentially in the same chamber 12. The basic configuration of the reactor 10 is available commercially under the trade name Epsilon™ from ASM America, Inc. of Phoenix, Ariz.

A plurality of radiant heat sources are supported outside the chamber 12 to provide heat energy in the chamber 12 without appreciable absorption by the quartz chamber 12 walls. The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Desirably, a portion of the radiant heat is diffusely reflected into the chamber 12 by rough specular reflector plates above and below the upper and lower lamps 13, 14, respectively. Additionally, a plurality of spot lamps 15 supply concentrated heat to the underside of the substrate support structure (described below), to counteract a heat sink effect created by cold support structures extending through the bottom of the reaction chamber 12.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors. The skilled artisan will appreciate, however, that the principles and advantages of the processes described herein can be achieved with other heating and temperature control systems.

A substrate, preferably comprising a silicon wafer 16, is shown supported within the reaction chamber 12 upon a substrate support structure 18. Note that, while the substrate of the illustrated embodiment is a single-crystal silicon wafer, it will be understood that the term "substrate" broadly refers to any surface on which a layer is to be deposited. Moreover, thin, uniform layers are often required on other substrates, including, without limitation, the deposition of optical thin films on glass or other substrates.

The illustrated support structure 18 includes a substrate holder 20, upon which the wafer 16 rests, and which is in turn supported by a support spider 22. The spider 22 is mounted to a shaft 24, which extends downwardly through a tube 26 depending from the chamber lower wall. Preferably, the tube 26 communicates with a source of purge or sweep gas which can flow during processing, inhibiting process gases from escaping to the lower section of the chamber 12.

A plurality of temperature sensors are positioned in proximity to the wafer 16. The temperature sensors can take any of a variety of forms, such as optical pyrometers or thermocouples. The number and positions of the temperature sensors are selected to promote temperature uniformity, as will be understood in light of the description below of the preferred temperature controller. In the illustrated reaction 10, the temperature sensors directly or indirectly sense the temperature of positions in proximity to the wafer.

In the illustrated embodiment, the temperature sensors comprise thermocouples, including a first or central thermocouple 28, suspended below the wafer holder 20 in any suitable fashion. The illustrated central thermocouple 28 passes through the spider 22 in proximity to the wafer holder 20. The reactor 10 further includes a plurality of secondary or peripheral thermocouples, also in proximity to the wafer 16, including a leading edge or front thermocouple 29, a trailing edge or rear thermocouple 30, and a side thermocouple (not shown). Each of the peripheral thermocouples are housed within a slip ring 32, which surrounds the substrate holder 20 and the wafer 16. Each of the central and peripheral thermocouples are connected to a temperature controller, which sets the power of the various heating elements 13, 14, 15 in response to the readings of the thermocouples.

In addition to housing the peripheral thermocouples, the slip ring 32 absorbs and emits radiant heat during high temperature processing, such that it compensates for a tendency toward greater heat loss or absorption at wafer edges, a phenomenon which is known to occur due to a greater ratio of surface area to volume in regions near such edges. By minimizing edge losses, the slip ring 32 can reduce the risk of radial temperature non-uniformities across the wafer 16. The slip ring 32 can be suspended by any suitable means. For example, the illustrated slip ring 32 rests upon elbows 34 which depend from a front chamber divider 36 and a rear chamber divider 38. The dividers 36, 38 desirably are formed of quartz. In some arrangements, the rear divider 38 can be omitted.

The illustrated reaction chamber 12 includes an inlet port 40 for the injection of reactant and carrier gases, and the wafer 16 can also be received therethrough. An outlet port 42 is on the opposite side of the chamber 12, with the wafer support structure 18 positioned between the inlet 40 and outlet 42.

An inlet component 50 is fitted to the reaction chamber 12, adapted to surround the inlet port 40, and includes a horizontally elongated slot 52 through which the wafer 16 can be inserted. A generally vertical inlet 54 receives gases from remote sources, as will be described more fully with respect to FIG. 2, and communicates such gases with the slot 52 and the inlet port 40. The inlet 54 can include gas injectors as described in U.S. Pat. No. 5,221,556, issued to Hawkins et al., or as described with respect to FIGS. 21-26 in U.S. Pat. No. 6,093,252, the entire disclosures of which are hereby incorporated by reference. Such injectors are designed to maximize uniformity of gas flow for the single-wafer reactor.

Figure 2:
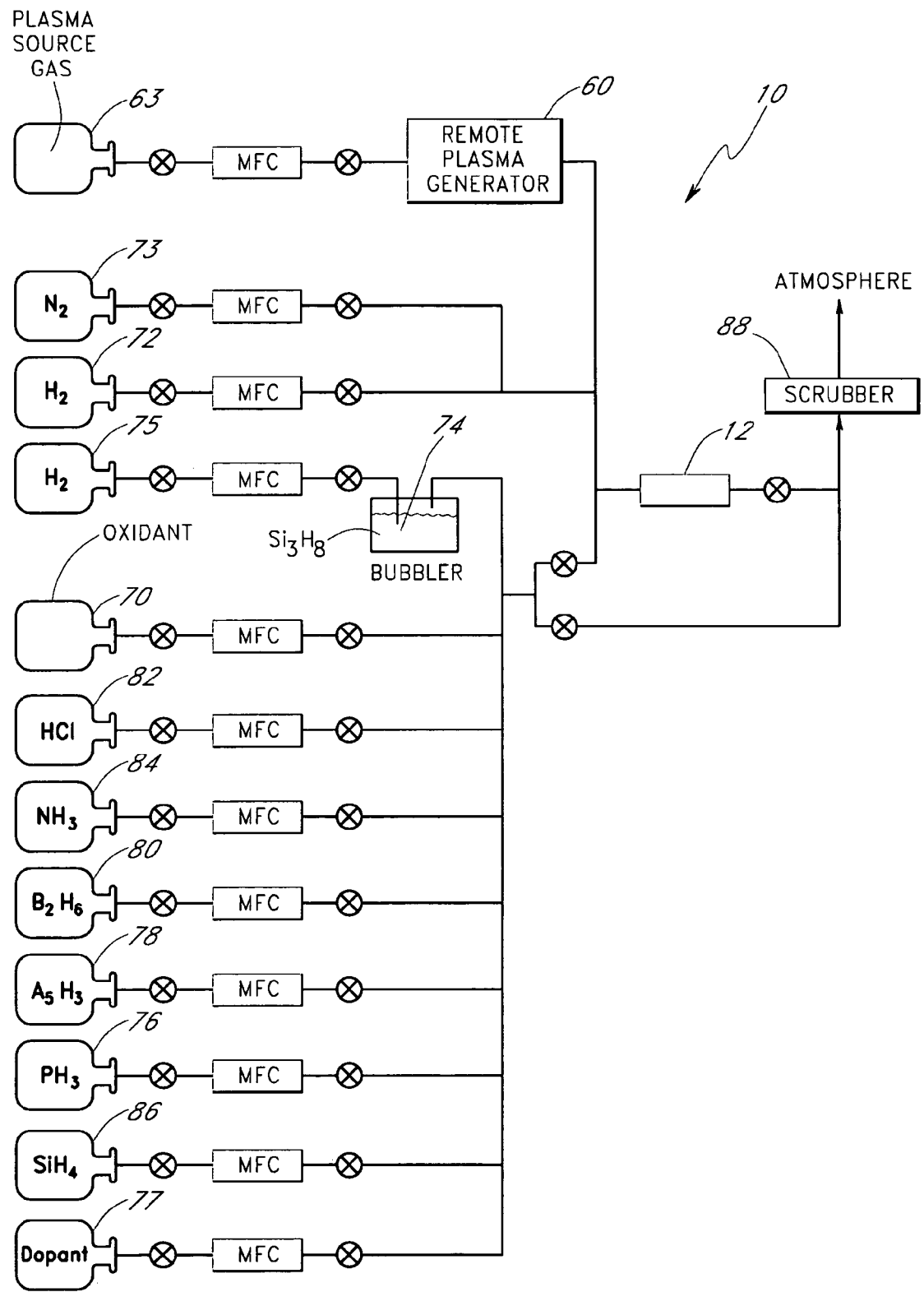
FIG. 2 is a gas flow schematic, illustrating exemplary reactant and inert gas sources in accordance with preferred embodiments of the invention.

An outlet component 56 similarly mounts to the process chamber 12 such that an exhaust opening 58 aligns with the outlet port 42 and leads to exhaust conduits 59. The conduits 59, in turn, can communicate with suitable vacuum means (not shown) for drawing process gases through the chamber 12. In the preferred embodiment, process gases are drawn through the reaction chamber 12 and a downstream scrubber 88 (FIG. 2). A pump or fan is preferably included to aid in drawing process gases through the chamber 12, and to evacuate the chamber for low pressure processing.

The reactor 10 also includes a source 60 of excited species, preferably positioned upstream from the chamber 10. The excited species source 60 of the illustrated embodiment comprises a remote plasma generator, including a magnetron power generator and an applicator along a gas line 62. An exemplary remote plasma generator is available commercially under the trade name TRW-850 from Rapid Reactive Radicals Technology (R3T) GmbH of Munich, Germany. In the illustrated embodiment, microwave energy from a magnetron is coupled to a flowing gas in an applicator along a gas line 62. A source of precursor gases 63 is coupled to the gas line 62 for introduction into the excited species generator 60. The illustrated embodiment employs nitrogen gas, flowed through an excited species generator to generate nitrogen radicals, as a precursor gas. A separate source of carrier gas 64 can also be coupled to the gas line 62, though in embodiments employing $N_2$ as the nitrogen source, separate carrier gas can be omitted. One or more further branch lines 65 can also be provided for additional reactants. Each gas line can be provided with a separate mass flow controller (MFC) and valves, as shown, to allow selection of relative amounts of carrier and reactant species introduced to the generator 60 and thence into the reaction chamber 12.

Wafers are preferably passed from a handling chamber (not shown), which is isolated from the surrounding environment, through the slot 52 by a pick-up device. The handling chamber and the process chamber 12 are preferably separated by a gate valve (not shown), such as a slit valve with a vertical actuator, or a valve of the type disclosed in U.S. Pat. No. 4,828,224.

The total volume capacity of a single-wafer process chamber 12 designed for processing 200 mm wafers, for example, is preferably less than about 30 liters, more preferably less than about 20 liters, and most preferably less than about 10. The illustrated chamber 12 has a capacity of about 7.5 liters. Because the illustrated chamber 12 is divided by the dividers 36, 38, wafer holder 20, ring 32, and the purge gas flowing from the tube 26, however, the effective volume through which process gases flow is around half the total volume (about 3.77 liters in the illustrated embodiment). Of course, it will be understood that the volume of the single-wafer process chamber 12 can be different, depending upon the size of the wafers for which the chamber 12 is designed to accommodate. For example, a single-wafer process chamber 12 of the illustrated type, but for 300 mm wafers, preferably has a capacity of less than about 100 liters, more preferably less than about 60 liters, and most preferably less than about 30 liters. One 300 mm wafer process chamber has a total volume of about 24 liters, with an effective processing gas capacity of about 11.83 liters. The relatively small volumes of such chambers desirably allow rapid evacuation or purging of the chamber between phases of the cyclical process described below.

FIG. 2 shows a gas line schematic, in accordance with the preferred embodiment. The reactor 10 is provided with a liquid reactant source 74 of trisilane as the preferred silicon precursor gas. An inert gas source 75 comprising a gas, preferably $H_2$, for bubbling liquid phase reactants 74 and carrying vapor phase reactants from the bubbler to the reaction chamber 12 is also shown. The bubbler holds liquid trisilane 74 as a silicon source, while a gas line serves to bubble the inert gas through the liquid silicon precursor and transport the precursors to the reaction chamber 12 in gaseous form.

At least one dopant source 77 is also provided. The dopant source 77 preferably comprises a carbon-containing precursor. Exemplary carbon-containing precursors include monomethyl silane, di-methyl silane, tri-methyl silane, tetra-methyl silane, mono-methyl disilane, di-methyl disilane, tri-methyl disilane, tetra-methyl disilane, mono-methyl trisilane, di-methyl trisilane, tri-methyl trisilane, tetra-methyl trisilane, methane, ethane, propane, butane, acetylene and combinations thereof. In other embodiments, the dopant source 77 can include a germanium precursor.

As also shown in FIG. 2, the reactor 10 further includes a source 72 of hydrogen gas ($H_2$). As is known in the art, hydrogen is a useful carrier gas and purge gas because it can be provided in very high purity, due to its low boiling point, and is compatible with silicon deposition.

The preferred reactor 10 also includes a source 73 of nitrogen gas ($N_2$). As is known in the art, $N_2$ is often employed in place of $H_2$ as a carrier or purge gas in semiconductor fabrication. Nitrogen gas is relatively inert and compatible with many integrated materials and process flows. Other possible carrier gases include noble gases, such as helium (He) or argon (Ar).

In addition, another source 63 of nitrogen, such as diatomic nitrogen ($N_2$), can be provided to a remote plasma generator 60 to provide active species for reaction with deposited silicon layers in the chamber 12. An ammonia ($NH_3$) source 84 can additionally or alternatively be provided to serve as a volatile nitrogen source for thermal nitridation. Moreover, as is known in the art, any other suitable nitrogen precursor can be employed and flowed directly, or through remote plasma generator 60, into the chamber 12. In other arrangements, the gas source 63 can comprise a source of other reactant radicals for forming silicon-containing compound layers (e.g., O, C, Ge, metal, etc.).

The reactor 10 can also be provided with a source 70 of oxidizing agent or oxidant. The oxidant source 70 can comprise any of a number of known oxidants, particularly a volatile oxidant such as $O_2$, NO, $H_2O$, $N_2O$, HCOOH, $HClO_3$.

Desirably, the reactor 10 can also include other precursor gases in additional dopant sources (e.g., the illustrated phosphine 76, arsine 78 and diborane 80 sources) and etchants for cleaning the reactor walls and other internal components (e.g., HCl source 82 or $NF_3/Cl_2$ (not shown) provided through the excited species generator 60). A source of silane 86 can also be provided, e.g., for deposition of a silicon layer after a first silicon layer has been deposited using a polysilane, as discussed below.

Each of the gas sources can be connected to the inlet 54 (FIG. 1) via gas lines with attendant safety and control valves, as well as mass flow controllers ("MFCs"), which are coordinated at a gas panel. Process gases are communicated to the inlet 54 (FIG. 1) in accordance with directions programmed into a central controller and distributed into the process chamber 12 through injectors. After passing through the process chamber 12, unreacted process gases and gaseous reaction by-products are exhausted to a scrubber 88 to condense environmentally dangerous fumes before exhausting to the atmosphere.

As discussed above, in addition to conventional gas sources, the preferred reactor 10 includes the excited species source 60 positioned remotely or upstream of the reaction chamber 12. The illustrated source 60 couples microwave energy to gas flowing in an applicator, where the gas includes reactant precursors from the reactant source 63. A plasma is ignited within the applicator, and excited species are carried toward the chamber 12. Preferably, of the excited species generated by the source 60, overly reactive ionic species substantially recombine prior to entry into the chamber 12. On the other hand, nitrogen radicals can survive to enter the chamber 12 and react as appropriate. Advantageously, the excited species generated by the source 60 enters the chamber 12 downstream of the main process gas inlet 40, relative to flowing the reactive species through the inlet 40, thereby shortening the path of reactive species to the substrate 16 and allowing more of the nitrogen radicals to survive.

Additionally, the plasma can be generated in situ, in the reaction chamber. Such an in situ plasma, however, may cause damage, uniformity and roughness problems with some deposited layers. Consequently, where a plasma is used, a remotely generated plasma is typically preferred.

While some preferred embodiments are presented in the context of a single-substrate, horizontal flow cold-wall reactor, it will be understood that certain aspects of the invention will have application to various types of reactors known in the art and that the invention is not limited to such a reactor. For example, batch reactors can be used and advantageously allow for increased throughput due to the ability to simultaneously process a plurality of wafers. Further details regarding deposition in a batch reactor are disclosed below.

Batch Reactor

FIGS. 3-8 illustrate two different versions of an exemplary batch reactor, commercially available under the trade name Advance 412™ or A412™ from ASM International N.V. of Bilthoven, The Netherlands. The illustrated reactor is a vertical furnace reactor, which has benefits for efficient heating and loading sequences. The skilled artisan will appreciate, however, that the principles and advantages disclosed herein will have application to other types of batch reactors.

Figure 3:
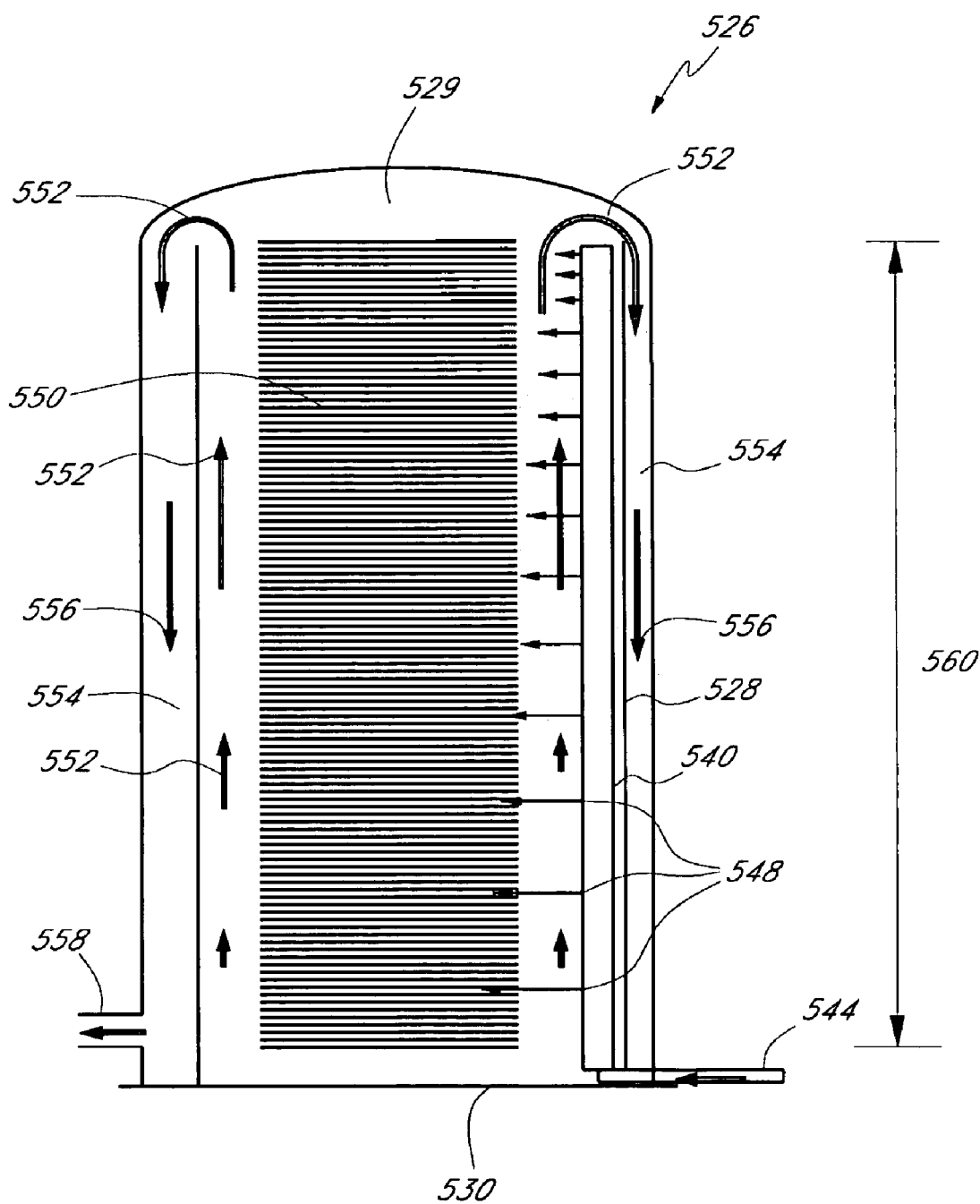
FIG. 3 is a schematic sectional view of an exemplary batch process tube for use with preferred embodiments of the invention.

With reference to FIG. 3, a schematic cross-sectional side-view is shown of an exemplary elongated furnace with a gas injector. The process tube or chamber 526 is preferably surrounded by a heating element (not shown). A liner 528, delimiting the outer perimeter of the reaction space 529, is preferably provided inside the process chamber 526. Preferably, at the bottom of the process chamber 526, a wafer load 550 may enter and exit the process chamber 526 by a door 530. Precursor gas is injected through a gas injector 540, preferably via a gas feed conduit 544. The gas injector 540 is provided with a pattern of holes 548, preferably extending substantially over the height of the wafer load 550. Note that, because gases are first introduced into the reaction space 529 from the holes 548 of the gas injector 540, the interior of gas delivery devices, such as the gas injector 540, through which gases travel is not part of the reaction space 529 and is, in a sense, outside of the reaction space 529. Consequently, the reaction space 529 comprises the interior volume of the process chamber 526, excluding the volume occupied by gas delivery devices such as the gas injector 540.

In a preferred embodiment, inside the process chamber 526, gas is flowed in a generally upward direction 552 and then removed from the reaction space 529 via the exhaust space 554 between the process chamber 526 and the liner 528, where gas flows in a downward direction 556 to the exhaust 558, which is connected to a pump (not shown). The gas injector 540 preferably distributes process gases inside the process chamber 526 over the entire height of the reaction space 529. The gas injector 540 itself acts as a restriction on the flow of gas, such that the holes 548 that are closer to the conduit 544 tend to inject more gas into the reaction space than those holes 548 that are farther from the conduit 544. Preferably, this tendency for differences in gas flows through the holes 548 can be compensated to an extent by reducing the distance between the holes 548 (i.e., increasing the density of the holes 548) as they are located farther away from the conduit 544. In other embodiments, the size of individual holes making up the holes 548 can increase with increasing distance from the conduit 544, or both the size of the holes 548 can increase and also the distance between the holes 548 can decrease with increasing distance from the conduit 544. Advantageously, however, the preferred embodiments are illustrated with holes 548 of constant size so as to minimize the surface area of the sides of the gas injector 540 containing the holes 548.

The injector 540 is advantageously designed to reduce the pressure inside the gas injector, resulting in a reduction of the gas phase reactions within the injector, since reaction rates typically increase with increasing pressure. While such reduced pressure can also lead to a poor distribution of gas over the height of the gas injector 540, the distribution of holes 548 across the height of the injector 540 is selected to improve uniformity of gas distribution.

Figure 4:
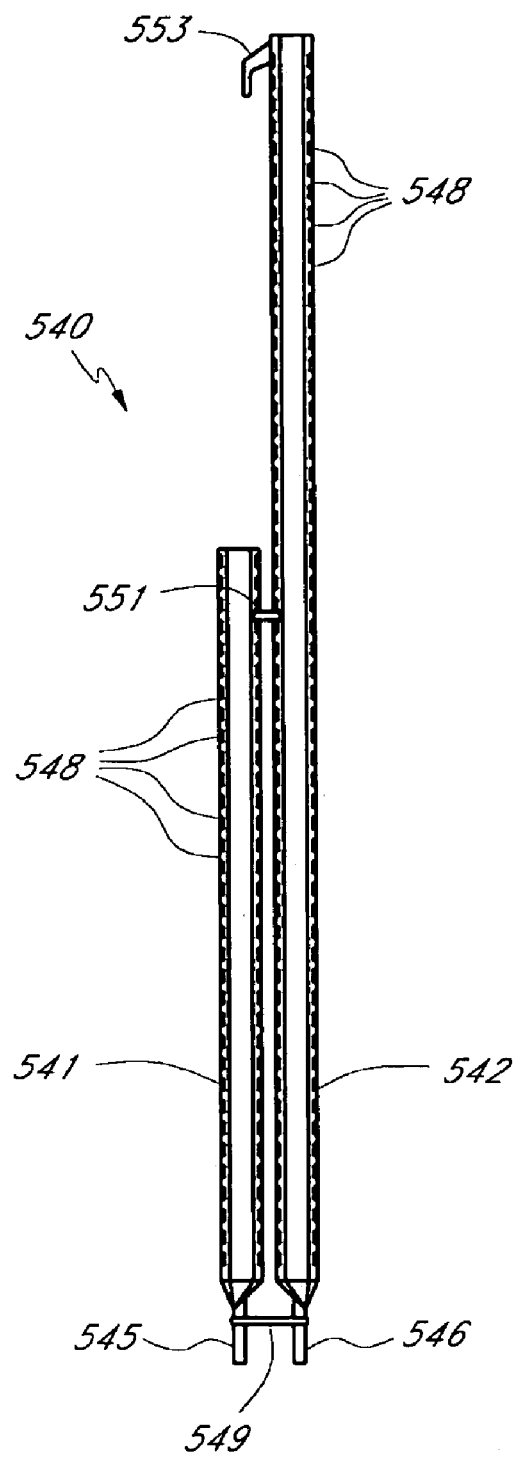
FIG. 4 is a front view of a gas injector for use with the batch process tube of FIG. 3.

The gas injector 540 in accordance with one illustrative embodiment of the present invention is shown in FIG. 4. The gas injector 540 preferably comprises two gas injector parts 541, and 542, each preferably provided with separate gas feed conduit connections 545 and 546, respectively. The first part 541 injects gas into the lower volume of the reaction space 529 (FIG. 3) and the second part 542 injects gas into the upper volume of the reaction space 529 (FIG. 3). The parts 541 and 542 are connected by linkages 549 and 551.

The gas injector 540 is provided with a pattern of holes 548 substantially extending over the height 560 (FIG. 3) of the wafer load 550 (FIG. 3). The total cross section of the holes is preferably at least about 30 mm$^2$. The diameter of each of holes 548 is preferably about 1 mm or more, more preferably between about 2.5 mm and about 3.5 mm, and most preferably about 3 mm. In the illustrative embodiment shown in FIG. 4, the gas injector 540 has 40 holes total for a total hole cross-sectional area of about 282 mm$^2$. More generally, the total cross-sectional area of the holes 548 is preferably about 30 mm$^2$ or more, and more preferably between about 196 mm$^2$ and about 385 mm$^2$.

Figure 5:
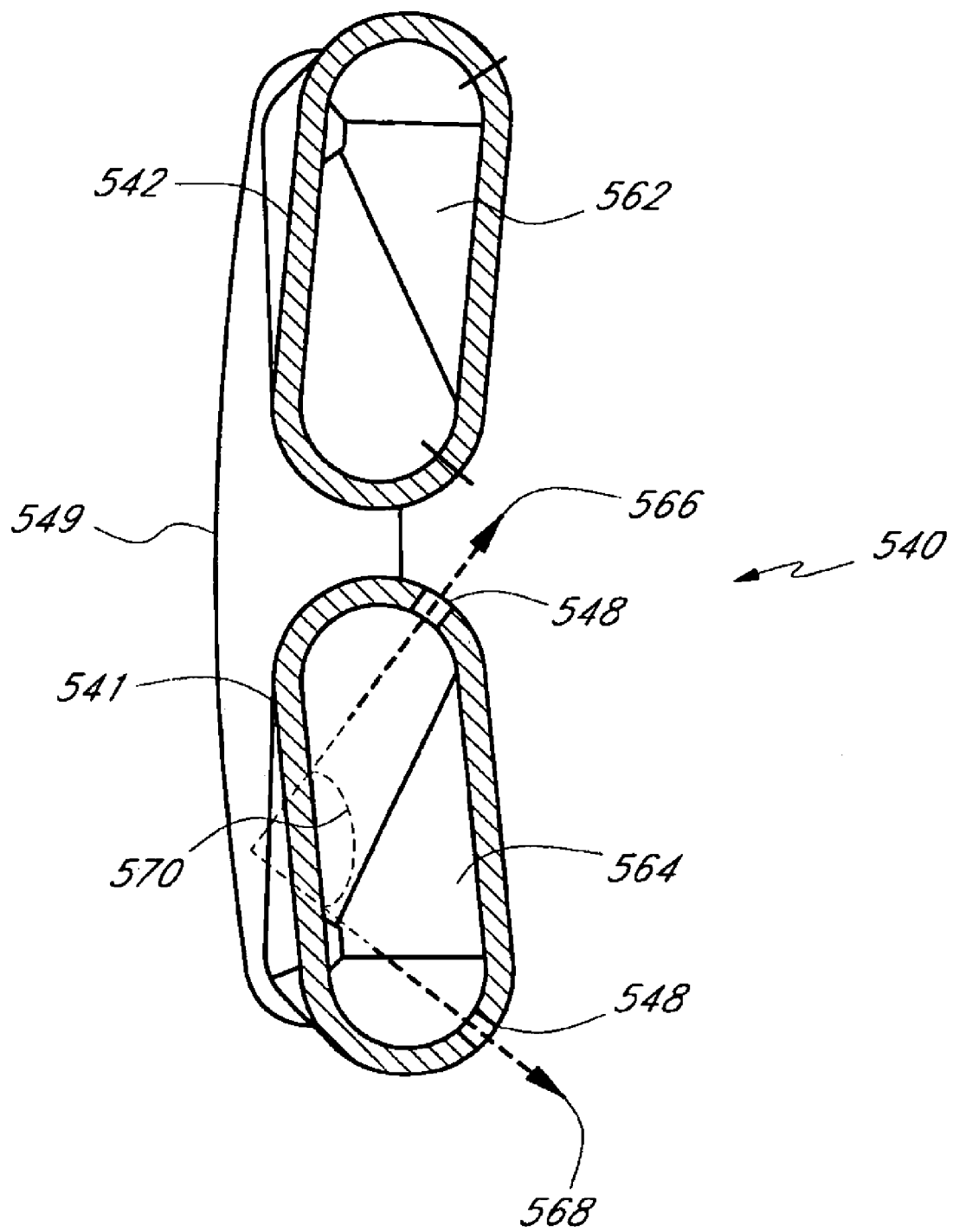
FIG. 5 is a horizontal cross-sectional view of the gas injector of FIG. 4.

With reference to FIG. 5, each part 541 and 542 of the gas injector 540 has an inner cross-sectional area 564 and 562, respectively, available for the conduction of precursor gases through the gas injector 540. Preferably, each of inner cross-sectional areas 564 and 562 are at least about 100 mm$^2$. In the illustrative embodiment, the cross-sectional area of each of the parts 541, 542 of the gas injector 540 is about 330 mm$^2$. More generally, the cross-sectional area of each of the parts 541, 542 is between about 140 mm$^2$ and about 600 mm$^2$, more preferably between about 225 mm$^2$ and about 455 mm$^2$. At its top end, the gas injector 540 can be provided with a hook 553 (FIG. 4), to secure the top end of the gas injector 540 to a hook support.

The cross-section of FIG. 5 is taken through the lower end of the gas injector 540 and straight through a pair of injection holes 548 provided in gas injector part 541, for injecting the gas in the lower end of the process chamber 526. Preferably, in each gas injector part, the holes 548 are provided in pairs, at the same height. In addition, the two holes 548 preferably inject the precursor gas in two directions 566 and 568 forming an angle 570 of between about 60 and 120 degrees, illustrated at about 90 degrees, to improve the radial uniformity. Moreover, as shown, the tubes comprising the gas injector 540 preferably have an oblong shape, as viewed in horizontal cross-section. Preferably, the longer dimension of the oblong shape faces the center of the process chamber 526 (FIG. 3), i.e., the side of the oblong shape with the longer dimension is perpendicular to an imaginary line extending radially from the center of the process chamber 526 (FIG. 3).

In a preferred embodiment, two precursor gases can each be injected via their own separate gas injectors 540 (not shown), so that they are first mixed after being injected into the reaction space 529 (FIG. 3). Consequently, it will be appreciated that more than one gas injector 540 may be located inside the process chamber 526 (FIG. 3).

Advantageously, the use of two gas injector parts 541 and 542 allows for further tuning possibilities. The flows supplied to the different gas injector parts 541, 542 can be chosen differently to fine-tune the gas flow into the reaction space 529. This will improve uniformity in the deposition rates of precursors over the height 560 of the wafer load 550 (FIG. 3).

Figure 6:
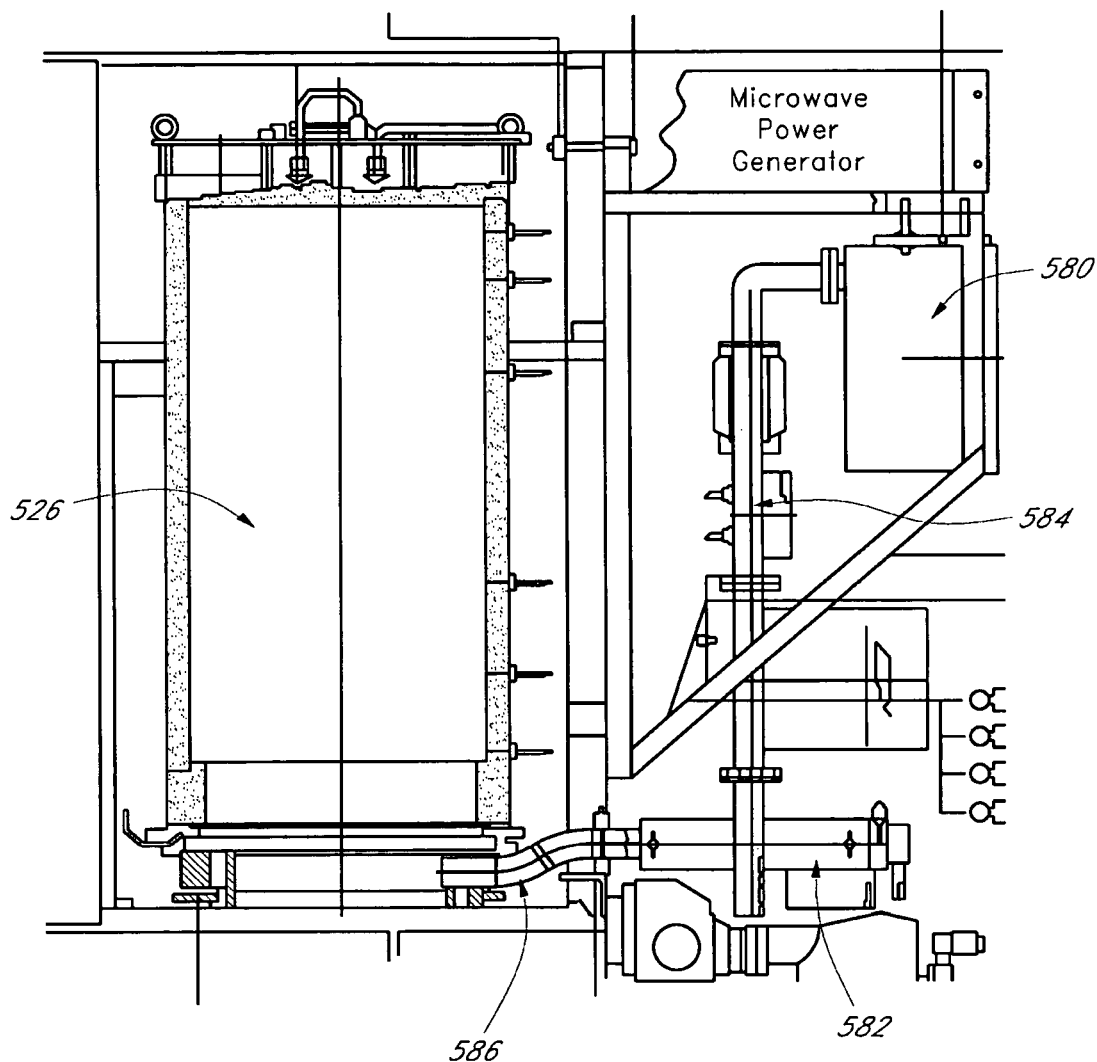
FIG. 6 is a schematic side view of a batch reactor with a remote plasma generator for supplying plasma products to a process tube, in accordance with one embodiment of the invention.

With reference to FIG. 6, a process tube 526 is shown in relation to a remote plasma generator. The illustrated remote plasma unit comprises a microwave radical generator (MRG) commercially available from MKS Instruments of Wilmington, Mass., USA, and includes a microwave power generator 580 coupled to a plasma cavity or applicator 582 through which a source of reactant flows during operation. Microwave power is coupled from the power generator 580 through a waveguide 584 to the plasma cavity 582. The reactant, preferably a source of nitrogen in the illustrated embodiments and most preferably diatomic nitrogen gas ($N_2$), flows through the plasma cavity 582 during operation and plasma products are carried to the process chamber 526 by way of a conduit 586. The conduit materials and length are preferably optimized to maximize the delivery of neutral nitrogen species (N) while minimizing recombination into $N_2$ and minimizing delivery of ions, as will be appreciated by the skilled artisan. The conduit can lead to a gas injector of the type illustrated in FIGS. 3-5, or can lead to a more conventional gas inlet, such as in the bottom flange of the process tube 526 from which plasma products (and other reactants) flow upwardly and diffuse laterally across the substrate surfaces.

The use of a remote MRG unit is particularly applicable to the pulsed trisilane process of the preferred embodiments. Unlike most batch processes, the nitridation (or other compound forming step) of the preferred embodiments is a self-limiting process, such that uniformity of radical distribution within the process chamber 526 is not essential. Over-reaction is not a concern from a result point of view. Nevertheless, non-uniformity of radical distribution is disadvantageous because it will prolong the nitridation process; nitridation would need to be conducted for a longer time to ensure complete nitridation across each wafer at every vertical position within the process chamber 526. Furthermore, aside from uniformity issues, the distance traversed from the plasma cavity 582 to the process chamber 526, and within the process chamber 526 to reach each wafer, leads to a relatively low radical survival rate due to the number of collisions en route that cause recombination.

Figure 7:
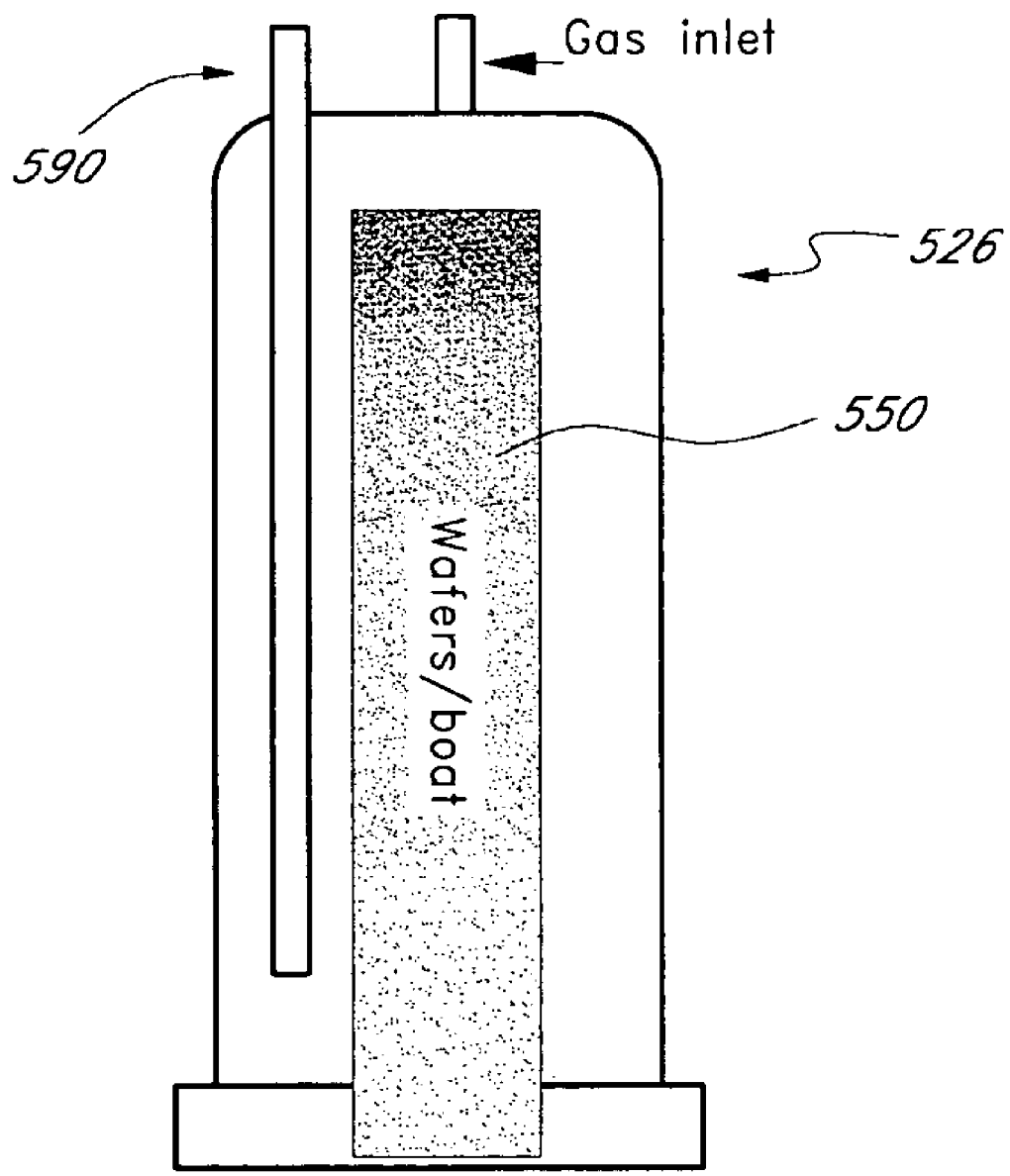
FIG. 7 is a schematic cross section of an in situ plasma source within a batch reaction tube, in accordance with another embodiment of the invention.

With reference to FIG. 7, in other arrangements, an in situ plasma source 590 is provided within the process chamber 526 to improve distribution of radicals across the wafers 550. Preferably the plasma source extends more than about half the height of the process chamber 526, more preferably extending at least 90% of the height of the wafer stack 550 within the process chamber 526.

Figure 8:
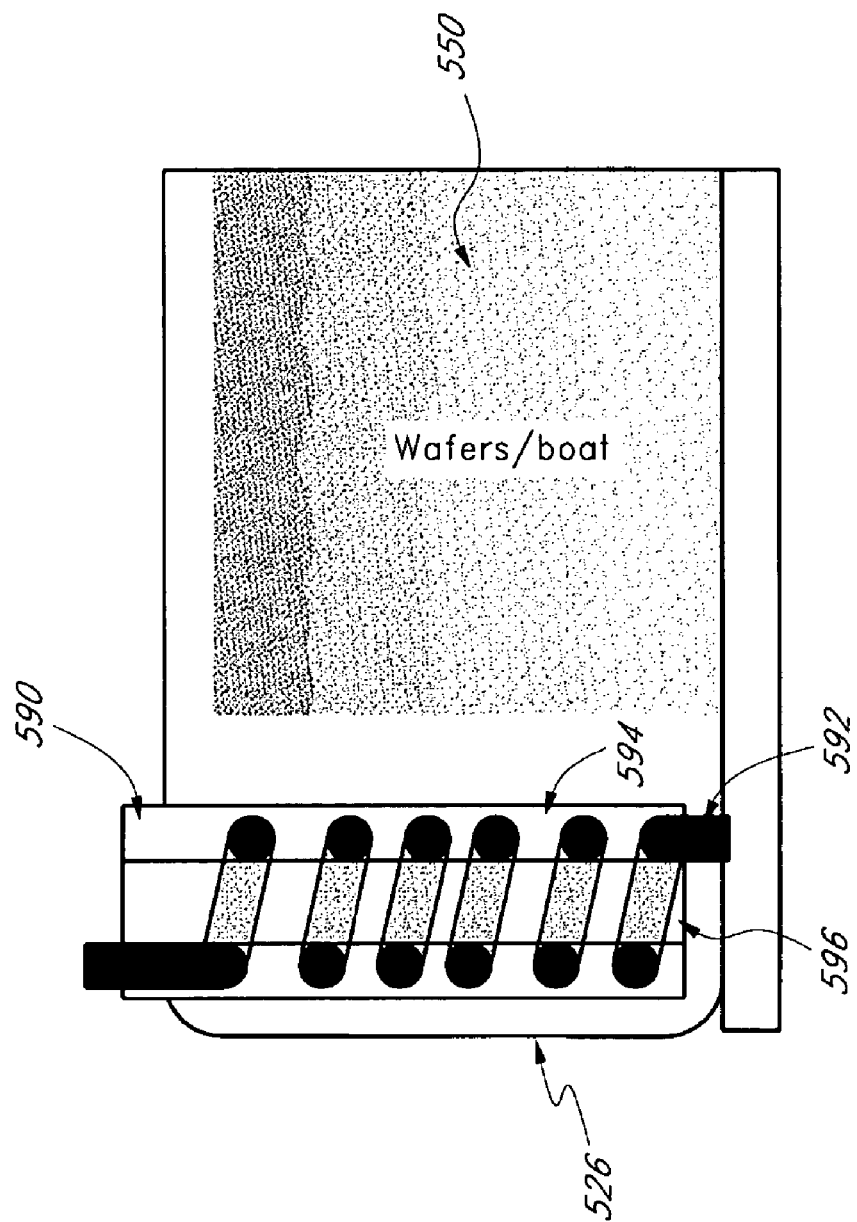
FIG. 8 is an enlarged schematic cross section of the in situ plasma source of FIG. 7.

With reference to FIG. 8, the plasma source 590 includes a conductor coil 592, such as copper, sealed within an insulating sleeve 594, such as quartz or more preferably sapphire. Optionally, a conductive core 596, such as iron or ferrite, is also included. The tube defined by the insulating sleeve 594 is preferably evacuated to avoid plasma generation within the tube.

In operation, a current is applied to the coil. A readily available radio frequency (RF) power source, e.g., 13.56 MHz, can be employed for this purpose. Process gases surrounding the plasma source 590, outside the insulating sleeve 594 but inside the process chamber 526, are ignited in an annulus surrounding the plasma source 590. Due to the proximity to the wafers 550, lower power can be employed, compared to use of a remote plasma generator. Symmetry of distribution across the wafers can be provided by rotating the wafer boat during operation.

Silicon Precursor

A silane is preferably used as the silicon precursor. The silane can be selected from the group consisting of monosilane ($SiH_4$), a polysilane and a chlorosilane ($SiH_{4-n}Cl_n$, where n=1 to 4).

Preferably, a polysilane is used as the silane to form the silicon layer 100. As used herein, a "polysilane" has the chemical formula $Si_nH_{2n+2}$, where n=2 to 4. Preferably, the polysilane is disilane or trisilane. Most preferably, the polysilane is trisilane. Consequently, while the invention is described in the context of particularly preferred embodiments employing CVD cycles with trisilane, the skilled artisan will appreciate, in view of the present disclosure, that certain advantages of the described processes can be obtained with other precursors and/or other deposition techniques.

Trisilane ($H_3SiSiH_2SiH_3$ or $Si_3H_8$) offers substantial benefits when used as a silicon precursor, as disclosed in U.S. application Ser. No. 10/623,482, filed Jul. 18, 2003; U.S. application Ser. No. 10/074,564, filed Feb. 11, 2002; and published PCT Application WO 02/064,853, published Aug. 2, 2002, the disclosures of which are hereby incorporated by reference in their entireties. For example, films can be deposited with trisilane at substantially lower temperatures than with other silicon precursors, such as silane. Moreover, deposition rates with trisilane are relatively insensitive to substrate material and thickness. Also, trisilane has an extremely short film nucleation time, which reduces the size of localized crystalline deposits of silicon. As a result, deposited silicon films can be made thinner, while still being uniform. Moreover, the films will show reduced surface roughness due to the reduced size of the localized silicon deposits.

In addition, with regards to process throughput, trisilane exhibits higher deposition rates relative to silane. Trisilane also reduces thermal budgets, since it allows use of lower process temperatures than does silane.

Thus, employing trisilane in the deposition methods described herein provides numerous advantages. For example, these deposition methods enable the production of silicon-containing compound films that are uniformly thin and continuous. These advantages, in turn, enable devices to be produced in higher yields, and also enable the production of new devices having smaller circuit dimensions and/or higher reliability. These and other advantages are discussed below.

Process Flow

As described in greater detail below, in forming a silicon-containing compound layer, a thin silicon layer is desirably deposited on a substrate by first exposing the substrate to a silicon precursor, preferably, trisilane. The silicon layer can then be reacted with another reactive species to form a silicon-containing compound layer. In a preferred embodiment, the other reactive species is a reactive nitrogen species. The reactive nitrogen species is introduced into the reaction chamber to nitride the silicon layer and form silicon nitride. Nitridation occurs when silicon in the silicon layer reacts with nitrogen from the reactive nitrogen species to produce silicon nitride. The nitridation is preferably limited to the silicon layer on the surface of the substrate and advantageously results in a substantially perfect stoichiometry in the reaction of the silicon layer with the reactive nitrogen species. Such a complete reaction allows less incorporated impurities, denser films, and improved thickness control and step coverage. In addition, stoichiometric silicon nitride layers have improved insulating properties, and can be made thicker than conventional insulating thin films, increasing the effectiveness of these deposited layers as diffusion barriers.

In other embodiments, the silicon layer can be reacted with reactants other than nitrogen to form other silicon-containing compound layers. For example, the silicon layer can be oxidized to form a silicon oxide layer. In such a case, an oxygen precursor can be used in place of a nitrogen precursor. The oxygen precursor can include, for example, atomic oxygen, water, ozone, oxygen, nitric oxide, nitrous oxide or other oxidants known in the art. Likewise, other precursors, known in the art, can be used to form silicon-containing compound layers including, but not limited to, silicon germanium, silicon carbide, metal silicides, etc.

In addition, multiple sequential cycles of these depositions and reactions can be performed to build up a silicon-containing compound layer to a desired thickness. Advantageously, different silicon-containing compound layers formed by the methods of the present invention can be formed one over another. For example, a silicon nitride film can be deposited over a silicon oxide film. In addition, the silicon-containing compound layer can be doped or otherwise further reacted. For example, a silicon nitride layer can be oxidized to form a silicon oxynitride layer.

During each of these cycles, a dopant is preferably added to the films to increase the tensile stress of the silicon-containing compound layers. The dopant is preferably carbon (where the film is not a silicon carbide film) or germanium (where the film is not a silicon germanium film). The substrate can be exposed to the dopant at any point(s) during a reaction cycle.

Figure 9:
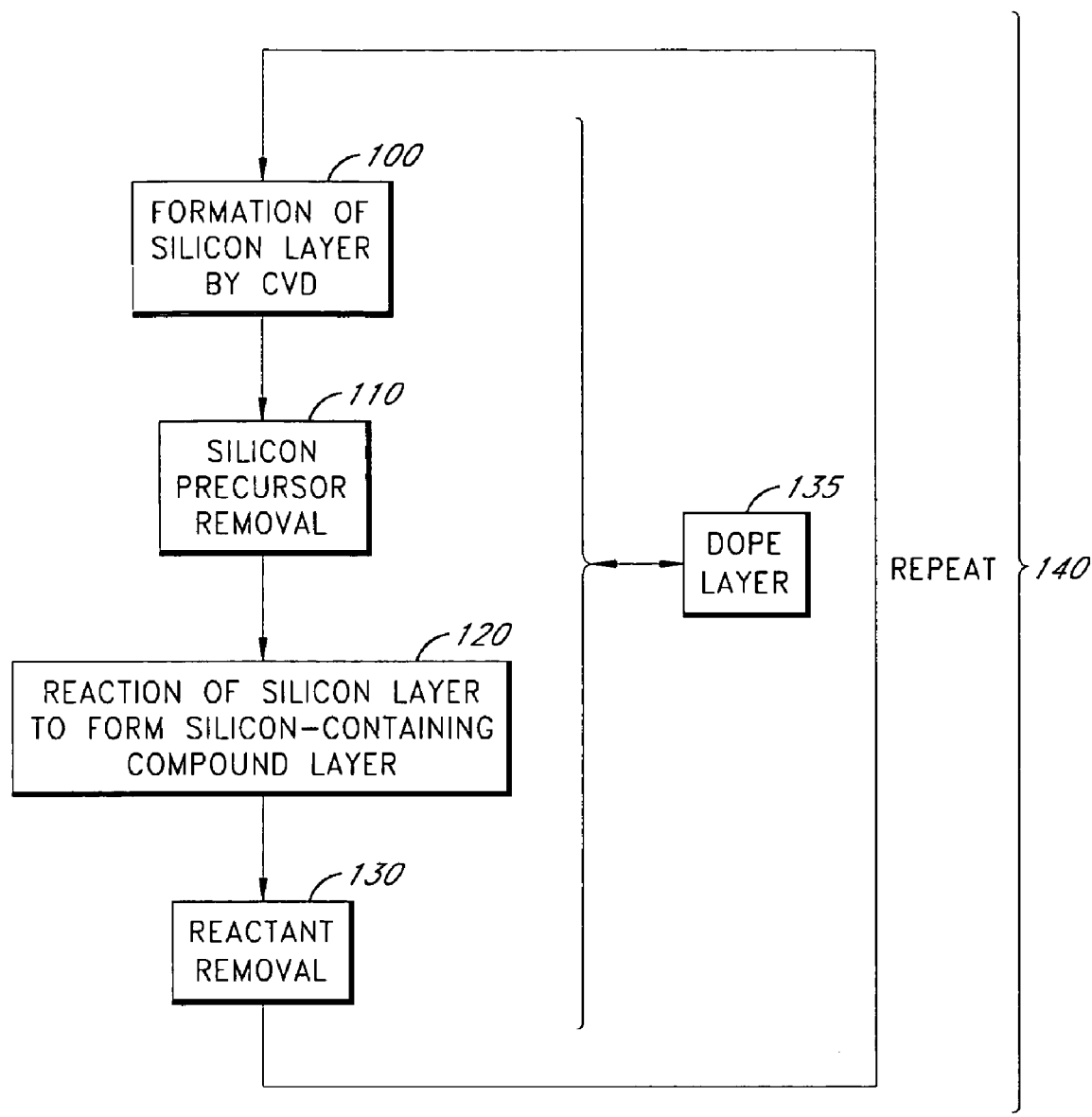
FIG. 9 is a flow chart generally showing steps for forming silicon-containing compound layers in accordance with preferred embodiments of the invention.

FIG. 9 shows a general process sequence in accordance with preferred embodiments of the invention. A substrate is provided in a process chamber and all sequence steps are preferably performed in situ in that process chamber.

In step 100, a silicon layer is formed on a substrate. "Substrate" is used herein in its usual sense to include any underlying surface onto which a silicon-containing material is deposited or applied in accordance with the preferred embodiments of the present invention. Preferred substrates can be made of virtually any material, including without limitation metal, silicon, germanium, plastic, and/or glass, preferably silicon compounds (including Si—O—C—H low dielectric constant films) and silicon alloys. Substrates can also have on them physical structures such as trenches or steps.

In forming 100 the silicon layer, deposition from a silicon precursor can be suitably conducted according to various deposition methods known to those skilled in the art, but the greatest benefits are obtained when deposition is conducted according to the CVD methods taught herein. The disclosed methods can be suitably practiced by employing CVD, including plasma-enhanced chemical vapor deposition (PECVD) or thermal CVD, utilizing gaseous trisilane to deposit a silicon-containing compound film onto a substrate contained within a CVD chamber. Thermal CVD is preferred for the silicon deposition phases of the process.

The polysilane is preferably introduced into the process chamber 12 (FIG. 1) or chamber 539 (FIG. 3) in the form of a feed gas or as a component of a feed gas. The feed gas can include gases other than the polysilane, such as inert carrier gases. The carrier gas can comprise carrier gases known in the art, such as nitrogen, hydrogen, helium, argon, or various combinations thereof. Preferably, nitrogen is used as the carrier gas for the methods described herein.

Where the polysilane is trisilane, the trisilane is preferably introduced into the chamber by way of a bubbler used with a carrier gas to entrain trisilane vapor, more preferably a temperature controlled bubbler.

Preferably, process conditions are tailored to processing in the particular type of reactor in which substrates are loaded. In general, deposition conditions are created to supply sufficient energy to pyrolize or decompose the silicon precursor on a hot substrate surface. For depositions in a single substrate reactor, the process conditions preferably allow a silicon deposition rate that is controlled primarily by the rate at which the silicon precursor is delivered to the substrate surface. Thus, for precursors such as trisilane, deposition is preferably conducted under chemical vapor deposition conditions that are in or near the mass transport limited regime. In the mass transport limited regime, deposition rates are essentially independent of temperature. Under such a regime small temperature variations across the surface of the substrate have little or no effect on deposition rate. It has been found that deposition in the mass transport limited regime greatly minimizes thickness and compositional variations and enables the production of the preferred silicon-containing compound films described herein. Thus, advantageously, such conditions allow for deposition with minimal loading effects or pattern sensitivity.

For such a single substrate reactor, the trisilane flow rate from the bubbler preferably is about 1 sccm to 1 slm, more preferably about 50 sccm to about 500 sccm. Preferably, the carrier gas has a flow rate is about 2 slm to about 20 slm.

The total pressure in the reaction chamber 12 (FIG. 1) is preferably in the range of about 0.001 Torr to about 780 Torr, more preferably in the range of about 0.001 Torr to about 100 Torr, most preferably in the range of about 0.001 Torr to about 10 Torr. The partial pressure of trisilane is preferably in the range of about 0.0001% to about 100% of the total pressure, more preferably about 0.001% to about 50% of the total pressure. The relative partial pressures of the polysilane and other components of the feed gas are preferably held relatively constant over the course of depositing the silicon-containing compound film. It will be appreciated, however, that silicon layer formation 100 and other steps need not necessarily be performed isobarically, e.g., Step 100 of FIG. 9 can be performed at a higher pressure than Step 120, or vice versa.

Advantageously, deposition in the pressure range of 0.001 Torr to 10 Torr results in excellent uniformity. In addition, low partial pressures are generally desirable to maintain a lower hydrogen content during the process. Due to the inherently lower H:Si ratio in silanes with higher numbers of silicon atoms, however, the partial pressure for, e.g., trisilane can be higher than that for lower order silanes, such as disilane and silane.

Preferably, silicon layer formation 100, and the cycle 140 generally, is performed isothermally. For thermal CVD, preferred deposition temperatures are in the range of about 400° C. to about 800° C., preferably about 450° C. to about 750° C., more preferably about 450° C. to about 650° C. Preferably, these temperatures correspond to the temperature setting for the substrate.

For depositions in a batch reactor, deposition conditions are preferably established so that the reaction rate of the silicon precursor is the limiting variable for the silicon deposition rate. Unlike single-wafer systems, batch systems, such as that of the illustrated vertical reactor, encounter difficulties in achieving an even distribution of precursor vapors across all wafers within the reaction tube in the mass transport limited regime. On the other hand, batch systems can often employ principles of hot wall reactors to achieve highly uniform temperature distributions. As a result, rather than the mass transport limited regime, the pulsed deposition is preferably conducted under reaction kinetics limited conditions, also known as the kinetic regime, wherein deposition rates are sensitive to temperature changes but relatively insensitive to supplied reactant concentrations.

It will be appreciated that a shift from mass transport limited to reaction kinetics limited is primarily achieved by a reduction in temperature. This results in a reduced film deposition rate that is preferable in a batch furnace. Because of the large batch size, an adequate throughput can still be achieved at a deposition rate that results from temperatures shifted down into the reaction rate limited regime. Advantageously, trisilane enables acceptable deposition rates at very low temperatures, allowing a considerably reduced consumption of thermal budgets. As the skilled artisan will readily appreciate, thermal budgets are constantly reduced as critical dimensions are scaled down, tolerances for diffusion are reduced, and new materials with lower resistance to thermal processing are introduced. The process is preferably operated at a temperature below about 600° C. and more preferably at a temperature below about 500° C., and even more preferably at a temperature between about 300° C. and about 500° C.

In addition to temperature, the skilled artisan will appreciate that the kinetic regime is partially dependent upon the reactant supply or partial pressure of trisilane. As long as the reaction rate is slower than the rate at which reactant is supplied, uniformity in a properly tuned batch furnace (in which uniform temperatures can be maintained) is excellent. Reference is made to Sze, *VLSI TECHNOLOGY*, pp. 240-41 (1988), the disclosure of which is incorporated herein by reference. In the illustrated batch reactors, process pressure is maintained at about 10 Torr or below and more preferably about 1 Torr or below. Trisilane preferably is supplied at less than about 100 sccm trisilane, and more preferably, at about 20 sccm. These flow rates preferably correspond to less than about 400.1 mg/minute and, more preferably, to about 80 mg/minute of trisilane flow into the reaction chamber of the reactor. The trisilane is typically diluted with a flow of a non-reactive or inert gas such as $N_2$, $H_2$, Ar or He. The trisilane partial pressure is thus preferably below about 10 mTorr, more preferably about 3-4 mTorr.

With continued reference to FIG. 9, in forming the preferred silicon-containing compound layers in either single substrate or batch reactors, the thickness of the film formed in Step 100 can be varied according to the intended application, as known in the art, by varying the deposition time and/or gas flow rates for a given set of deposition parameters (e.g., total pressure and temperature). For a particular set of deposition conditions, the duration of silicon deposition for silicon layer formation 100 is preferably chosen so that a thin silicon layer is formed. By forming thin and uniform silicon layers, the layers can be easily fully reacted, e.g., nitrided, allowing for the formation of the thin and uniform silicon-containing compound layers described below. Consequently, at process temperatures of less than about 650° C., the thickness of the silicon layer is preferably between about 3 Å and 25 Å, more preferably between about 3 Å and 15 Å, and most preferably between about 3 Å and 8 Å. It will be appreciated, however, that the preferred thickness range can vary depending upon process conditions such as temperature. At higher temperatures, thicker silicon layers can still be deposited while still allowing the layer to be fully reacted. For example, at temperatures of about 900° C. or higher, silicon layers of about 20-50 Å can be used.

After silicon layer formation 100, any excess silicon precursor and byproduct can be removed 110 from the process chamber. Silicon precursor removal 110 can occur by any one, or any combination of removal processes, including the following: purging of the process chamber with inert gas, evacuation of the silicon precursor, or displacement of the silicon precursor gas by a gas carrying a reactive species. Where silicon precursor gas removal 110 is accomplished by displacement of the precursor gas with a gas carrying a reactive species, however, the process chamber is preferably a single substrate laminar flow chamber such as an ASM Epsilon™ series single wafer reactor, described above and illustrated in FIG. 1. In addition, where silicon precursor gas removal 110 is performed by purging, the process chamber 12 or chamber 529 is preferably purged for a duration long enough to replace the atmosphere in the chamber at least once.

It will be appreciated that silicon precursor gas removal 110 is preferably performed such that the quantity of a particular reactant in the chamber 12 (FIG. 1) is at a level sufficiently low as to minimize unwanted side reactions with the next reactant to enter the chamber 12. This in turn minimizes undesirable incorporation of impurities in the silicon-containing compound layers that are formed. Such a low level of reactants can be achieved by, for example, optimizing the duration of a purge or evacuation of chamber 12. At such a level, the process chamber can be said to be substantially free of a particular reactant. An exemplary purge flow for a batch reactor is 5 slm $N_2$. While other non-reactive gases can be used, $N_2$ has particular advantages for efficiency in the nitridation process described herein. For example, as discussed below, to nitride a silicon layer, activated species can be supplied by simply continuing the $N_2$ flow and turning on plasma power to activate nitrogen radicals and then turning off the plasma power to purge the chamber again.

With continued reference to FIG. 9, after silicon precursor gas removal 110, the silicon layer can be reacted 120 with a reactive species for formation of a silicon-containing compound layers. Such a reactive species can include, as noted above, a reactive nitrogen species for forming silicon nitride layers, or a reactive oxygen species for forming silicon oxide layers. Preferably, the silicon layer formed in Step 100 is exposed to the inflowing reactive species for a duration sufficient to completely stoichiometrically react with the reactive species. More preferably, the reaction conditions are chosen to completely react the silicon layer formed and to avoid damage to underlying structures, as discussed in more detail below with respect to the formation of silicon nitride layers. Where the silicon-containing compound layers are silicon nitride layers, the reactive nitrogen species preferably comprises nitrogen radicals. In other embodiments, the reactive nitrogen species can be ammonia.

As discussed above, the nitrogen radicals can be generated in various ways. In preferred embodiments, the nitrogen radicals are generated by the application of a high frequency electrical power, preferably in the GHz range. For example, using microwave energy, the remote plasma generator 60 (FIGS. 1 and 2) can be used to generate radicals for entry into the chamber 12.

In another example, for the batch reaction chamber 526 (FIG. 6), the nitrogen radicals are generated in a remote microwave radical generator (MRG) from MKS Instruments. The radicals can be generated by flowing about 1 to about 5 slm $N_2$ through the MRG under the application of about 3 kW microwave power at about 2.45 GHz. Optionally, the remotely generated radicals can be distributed over the entire wafer load by the use of one or more gas injectors, as discussed above. Alternatively, the nitrogen radicals can also be generated inside the furnace chamber, preferably over the entire length of the vertically elongated chamber. This can be achieved by the coupling of high frequency electrical power into the process tube. In the embodiment of FIGS. 7 and 8, this coupling occurs through a coil that is inserted into the process tube. As noted above, the coil is preferably placed inside a protective tube of electrically insulating material, and this tube is preferably evacuated to pressures below about 100 mTorr to avoid the generation of plasma inside the tube.

It will be appreciated that formation of the silicon-compound layer 120 can include reaction of the silicon layer with more than one reactive species, even where the atomic species of interest for the different reactive species is the same. For example, where the atomic species of interest is nitrogen to form silicon nitride layers, a beneficial effect is observed by the use of an $NH_3$ flow in addition to a nitrogen radical flow.

This NH₃ is fed directly in the process tube, rather than via the radical generator. Although non-activated NH₃ reacts minimally with silicon at temperatures below 500° C., it has been found that the addition of non-activated NH₃ to the nitrogen radicals results in a more fully nitrided amorphous silicon layer, as evidenced by a lowered refractive index. Without being limited by theory, it is believed that the nitrogen radicals from a remote plasma generator activate the ammonia within the process chamber. In contrast, nitrogen radicals alone leave a slightly silicon-rich silicon nitride film, as evidenced by a slightly higher refractive index. It has also been found that ammonia provided through the remote MRG actually decreased the nitridation effect, even relative to nitrogen radicals alone.

With reference to FIG. 9, after formation of the silicon-containing compound layers 120, reactant removal 130 can be performed using any of the methods described above for silicon precursor removal 110. It will be appreciated, however, that Steps 110 and 130 need not occur by exactly the same methods, e.g., one step can involve purging, while the other can involve evacuating. As noted above, since N₂ and NH₃ (at low temperatures) are non-activated when plasma power is off (e.g., during purge steps and silicon deposition steps), neither gas reacts significantly and benefits can be obtained by a constant supply of the gas, such as avoidance of pressure fluctuations. Thus, the removal Steps 110 and 130 can be accomplished simply by shutting off the supply of silicon precursor and turning off the plasma power while continuing to flow N₂ and/or NH₃ (at low temperatures), respectively.

Accordingly, performance of the steps 100, 110, 120, and 130 comprises one cycle 140 and deposits one layer of a silicon-containing compound on a substrate. The cycle 140 can then be repeated in sequence until the silicon-containing compound layers are built up to a desired thickness.

At any time during the cycle, a dopant precursor can be introduced into the reaction chamber 12 (FIG. 1) or 529 (FIG. 3, 6 or 7) to dope the silicon or silicon-containing compound film in Step 135. For example, the dopant precursor can be introduced during any of Steps 100, 110, 120 and/or 130. It will be appreciated that the dopant precursor can be introduced concurrently with any other precursor, or it can be introduced at times separate from the introduction of the other precursors.

Preferably, the dopant is carbon. Exemplary carbon precursors include mono-methyl silane, di-methyl silane, tri-methyl silane, tetra-methyl silane, mono-methyl disilane, di-methyl disilane, tri-methyl disilane, tetra-methyl disilane, mono-methyl trisilane, di-methyl trisilane, tri-methyl trisilane, tetra-methyl trisilane, methane, ethane, propane, butane, acetylene and combinations thereof. Preferably, the carbon precursor is a methyl silane, having one or more silicon-carbon bonds and having no carbon-carbon bonds. Such a compound has relatively weak silicon-hydrogen and carbon-hydrogen bonds. These bonds can be broken at relatively low temperatures, thus allowing the use of low processing temperatures. Mono-methyl silane is particularly advantageous because of its high vapor pressure. In addition to carbon, an example of another dopant is germanium.

In some embodiments, to increase the dopant level, it will be appreciated that the dopant can be introduced into the reaction chamber one or more times during a cycle 140. Alternatively, the duration that a dopant is introduced into the chamber can be increased to achieve the same effect. In addition, the dopant concentration can be controlled by the appropriate selection of a dopant precursor. For example, where a higher carbon concentration is desired, the dopant precursor can be selected based upon the number of silicon-carbon bonds present in the precursor. For example, rather than mono-methyl silane, tetra-methyl silane can be used.

The skilled artisan will appreciate that the present invention allows for the formation of layers of various thicknesses, a thickness being selected, for example, based upon the requirements of a particular application. For instance, for use as a transistor liner, sufficient cycles are preferably conducted to grow a silicon nitride layer between about 100 Å and 2000 Å in thickness. It will be appreciated, however, that greater thicknesses are possible; for example, thicknesses up to about 5000 Å can be formed after performing a sufficient number of cycles.

As noted above, the present invention can be utilized to form a carbon doped silicon nitride layers. FIG. 10 illustrates possible process sequences for forming such a layer for, e.g., use as a transistor liner.

Figure 10A:
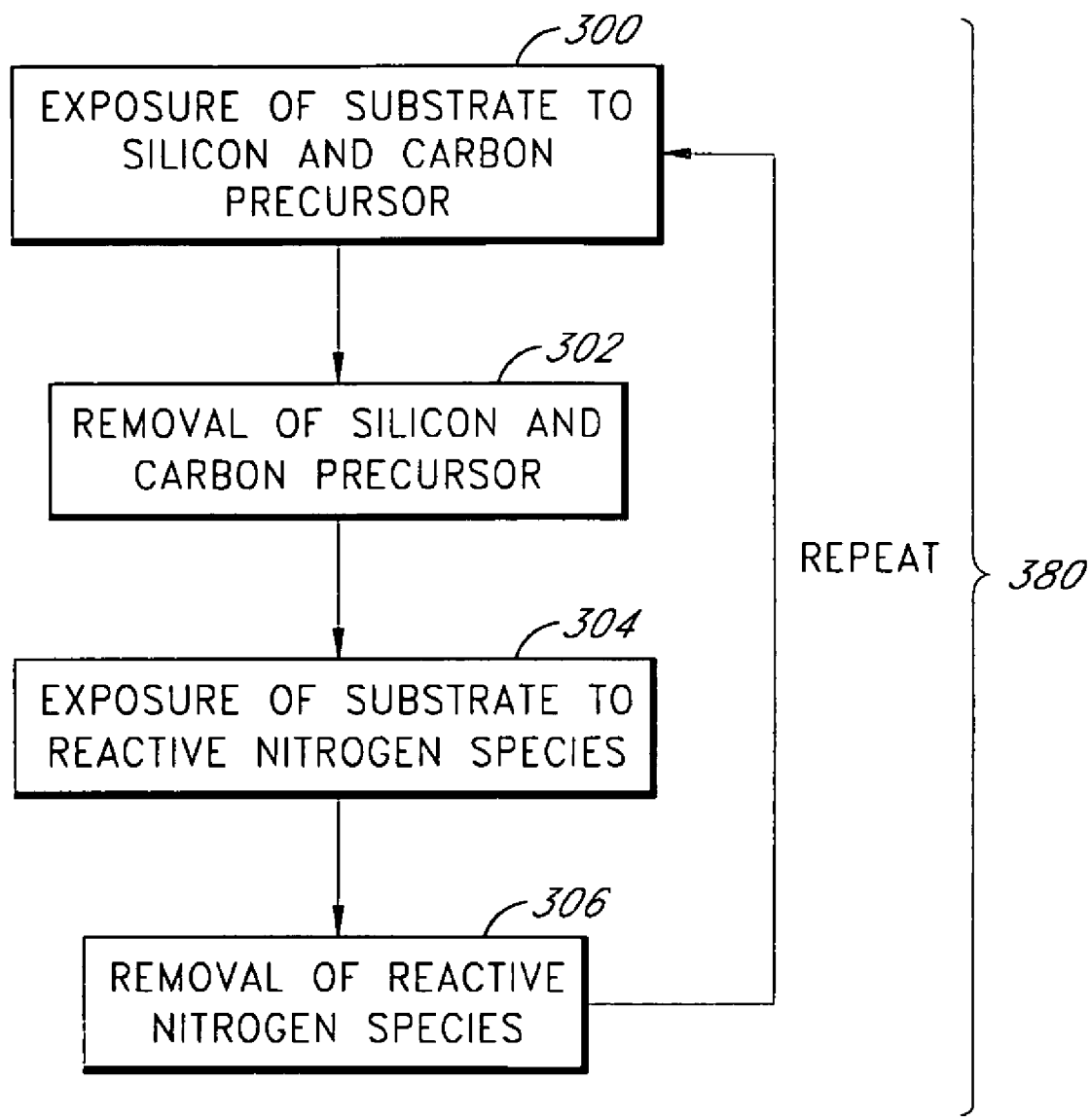
FIGS. 10A-10C are flow charts generally showing steps for forming a doped silicon-nitride compound layer in accordance with preferred embodiments of the invention.

In FIG. 10A an embodiment is shown wherein the substrate is exposed to the carbon precursor concurrently with the silicon precursor. After loading a substrate into a reaction chamber, a carbon doped silicon layer is formed 300 on the substrate by exposing the substrate to a pulse of silicon precursor and carbon precursor. Preferably, the carbon doped silicon layer is deposited on the substrate by thermal CVD using trisilane as the silicon precursor and mono-methyl silane as the carbon precursor, under the conditions discussed above.

While the preferred embodiments allow silicon layers or carbon doped silicon layers of various thicknesses to be formed, preferably, the silicon layer thickness is chosen based upon nitridation conditions. This is because, during nitridation of a silicon layer atomic nitrogen can diffuse through the silicon layer and into the underlying silicon substrate. The depth of this nitrogen diffusion can be measured, as known in the art, and is related to various process conditions, including nitridation temperature and duration of nitridation. Thus, for a given set of process conditions, atomic nitrogen will diffuse into, and possibly through, the silicon layer to a particular depth, called the nitridation saturation depth. When nitridation occurs for less than about one minute, the nitridation saturation depth can be termed the short-term nitridation saturation depth.

As discussed below in the discussion of the Deposited Silicon-containing Compound Layers, nitridation of the substrate has been found to result in silicon nitride layers with dielectric properties which are inferior to what is theoretically expected. Thus, to improve the dielectric properties of deposited silicon nitride films, nitridation of the underlying substrate is preferably minimized, preferably by depositing the first silicon layer formed over a substrate to a thickness equal to or greater than the nitridation saturation depth. It will be appreciated that subsequently deposited layers will typically be spaced farther from the substrate than the nitridation saturation depth as a consequence of being deposited over this first silicon layer. As a consequence, the thickness of silicon layers deposited after the first layer preferably are less than or equal to the nitridation saturation depth.

For a given set of nitridation conditions, however, after forming the first silicon layer, silicon layers formed in subsequent cycles can be thinner since the nitridation saturation depth remains relatively constant while the silicon nitride layer thickness increases. For example, in preferred embodiments, the first silicon layer can be deposited to about the nitridation saturation depth, e.g., about 8 to 20 Å, and subsequent layers can be deposited to a thinner thickness, e.g., about 3 Å to 10 Å per cycle. In one preferred embodiment, the first silicon layer is deposited to a thickness of about 12 Å and subsequent layers are deposited to a thinner thickness of about 6 Å per cycle. In addition to varying the thickness of the silicon layer, it will be appreciated that other process conditions, such as the nitridation temperature and/or the duration of nitridation, can be varied so that the nitridation saturation depth is not deeper than the thickness of the silicon layer.

In the embodiment shown in FIG. 10A, after Step 300, any excess trisilane and mono-methyl silane is preferably removed 302 from the reaction chamber by, e.g., purging the chamber with inert gas. A silicon nitride layer is then formed 304 by introduction of a reactive nitrogen species into the chamber 12 (FIG. 1). Exemplary reactive nitrogen species include chemical species such as $(H_3Si)_3N$ (trisilylamine), ammonia, atomic nitrogen, hydrazine ($H_2N_2$), hydrazoic acid ($HN_3$), $NF_3$, mixtures of the foregoing and dilutions of the foregoing with inert gases (e.g., $H_2$, $N_2$, Ar, He). Most preferably, atomic nitrogen or ammonia is the reactive nitrogen species.

Atomic nitrogen is preferably generated using an excited species generator. Nitrogen gas preferably is flowed through the excited species generator at about 1 slm to about 10 slm to generate the atomic nitrogen. More preferably, the nitrogen flow is combined with a carrier gas of helium, the carrier gas preferably having a flow between about 1 slm to 10 slm.

Any excess reactive nitrogen species is then preferably removed 306 from the reaction chamber by, e.g., purging the chamber with inert gas. The steps 300-306 constitute a cycle 380 which can be repeated until a layer of a desired thickness is formed.

Figure 10B:
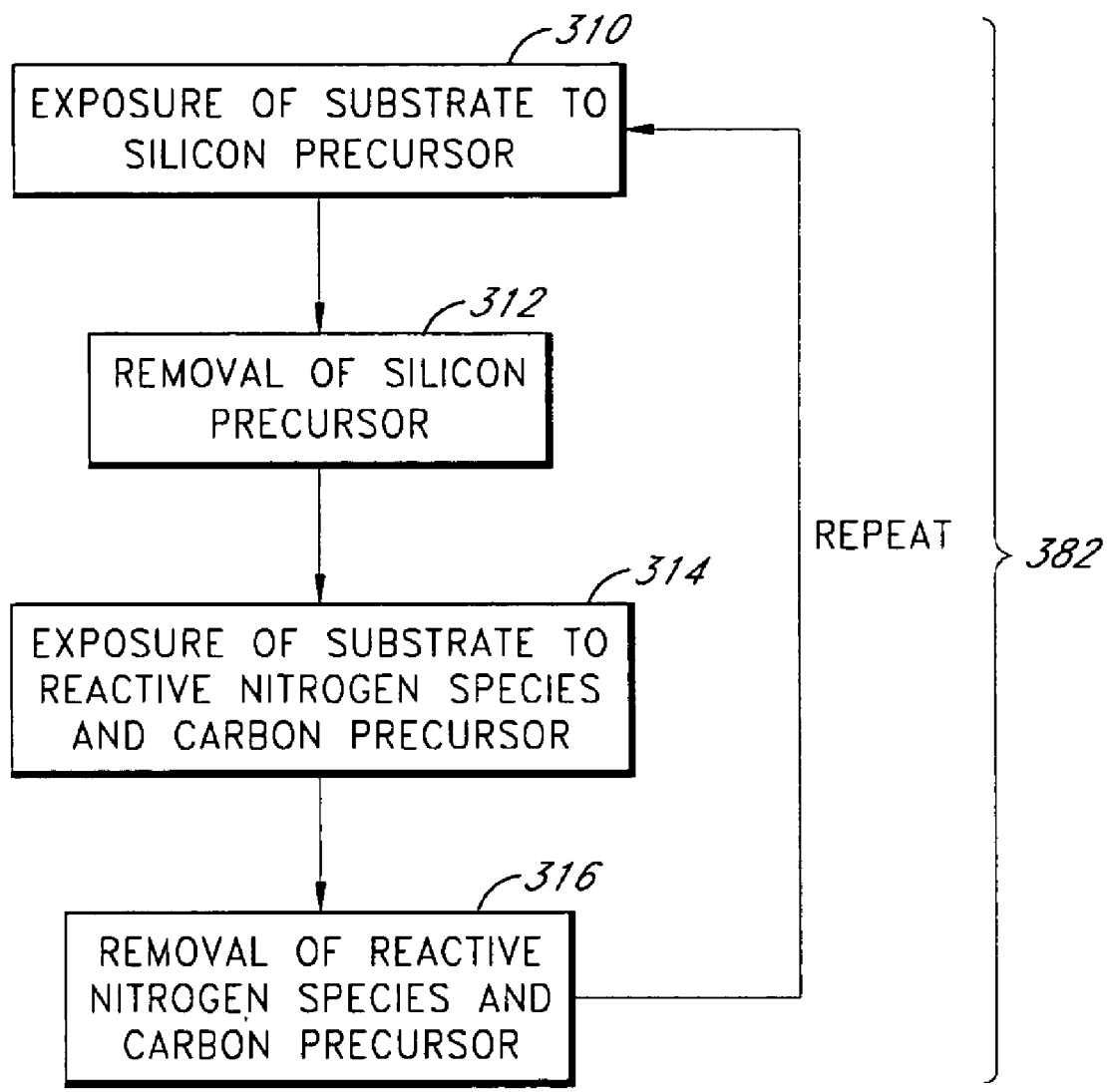

In FIG. 10B, an embodiment is shown wherein the carbon precursor is fed into the reaction chamber simultaneously with the pulse of the reactive nitrogen species. In step 300 the substrate is exposed to a silicon precursor, preferably trisilane. In step 312 any excess silicon precursor is removed from the reaction chamber. In step 314 the substrate is exposed to the reactive nitrogen species, preferable atomic nitrogen, and the carbon precursor, preferably mono-methyl silane. In step 316 any excess reactive nitrogen species and carbon precursor are removed from the reaction chamber. The steps 310-316 constitute a cycle 382 which can be repeated until a layer of desired thickness is formed.

Figure 10C:
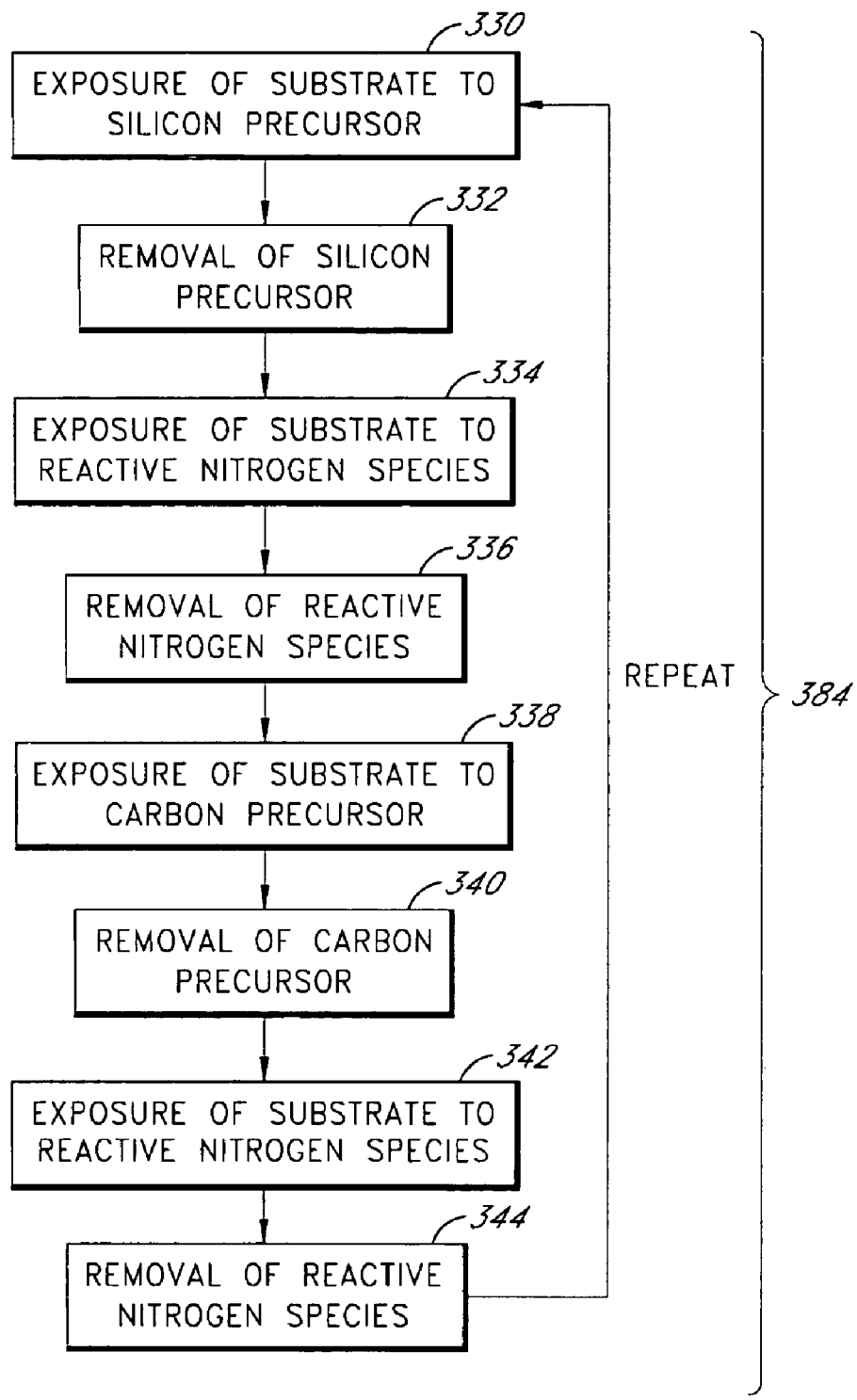

In FIG. 10C, an example of an embodiment is shown wherein each precursor is fed into the reaction chamber separately from the other precursors. In step 330 the substrate is exposed to the silicon precursor, and in step 332 any excess silicon precursor is removed from the reaction chamber. In step 334 the substrate is exposed to a reactive nitrogen species and in step 336 any excess reactive nitrogen species is removed from the reaction chamber. In step 338 the substrate is exposed to a carbon precursor and in step 340 any excess carbon precursor is removed from the reaction chamber. In step 342 the substrate is exposed to the reactive nitrogen species again and in step 344 any excess reactive nitrogen species is removed from the reaction chamber. Steps 330-344 constitute a cycle 384 which can be repeated until a layer of desired thickness is formed. In other embodiments, instead of the sequence shown in FIG. 10C, different sequences can be utilized in which the order and number of pulses of the precursors differ from that illustrated, e.g., in one a sequence the substrate is exposed only once to each precursor in each cycle.

Accordingly, preferred embodiments for a process to form carbon doped silicon nitride layers include the following steps for introduction of reactants:

Separated pulses of silicon precursor and nitrogen reactive species
Pulse of carbon precursor.

In one preferred embodiment, reactants are introduced as follows:
Pulse of silicon precursor and carbon precursor
Pulse of reactive nitrogen species In an alternative embodiment, a process to form carbon doped silicon nitride includes the following steps for introduction of precursors:
Pulse of silicon precursor
Pulse of reactive nitrogen species and carbon precursor In yet another embodiment a process to form carbon doped silicon nitride includes the following steps for introduction of precursors:
Pulse of silicon precursor
Pulse of reactive nitrogen species
Pulse of carbon precursor
Pulse of reactive nitrogen species.

Figure 11:
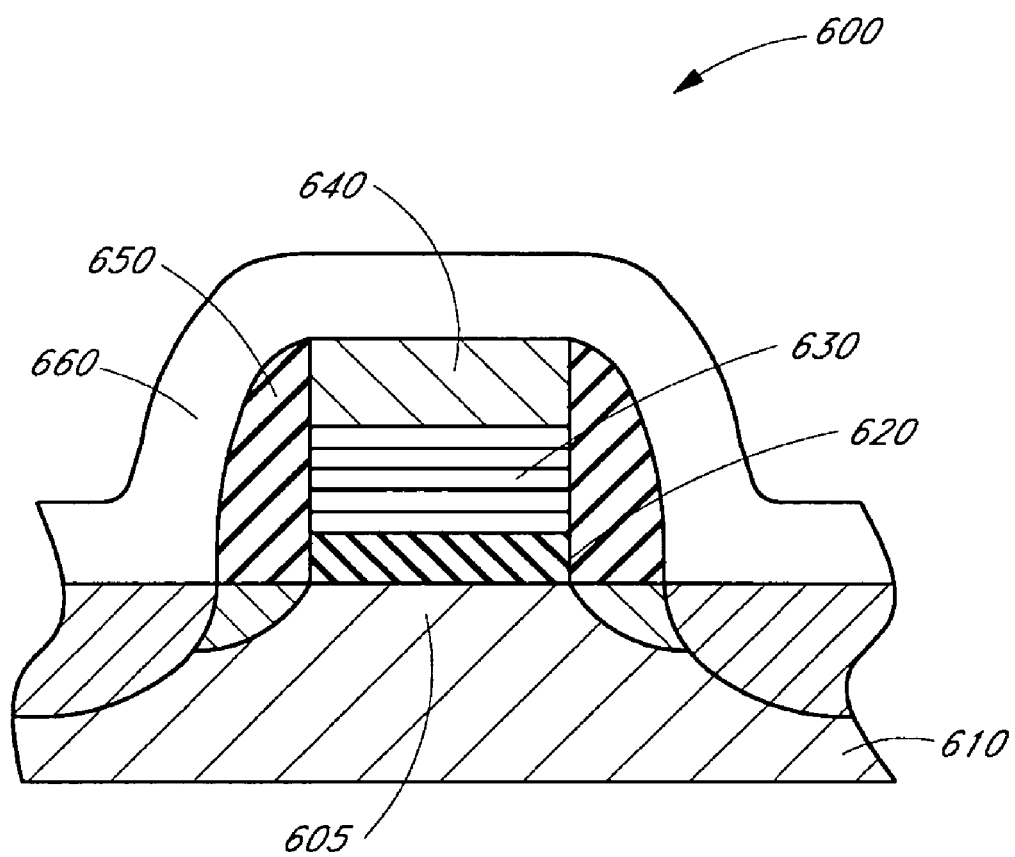
FIG. 11 is a schematic illustration of a transistor with a silicon nitride liner formed in accordance with preferred embodiments of the invention.

With reference to FIG. 11, the resulting carbon doped silicon nitride layer is shown as a liner 660 in a transistor 600. The liner 660 directly overlies sidewall spacers 650 and a dielectric cap 640. The dielectric cap 640 overlies a gate electrode 630 and a gate dielectric 620. All these features overlie a substrate 610. Advantageously, the high tensile stress of the silicon nitride film 660 allows the film to effectively enhance carrier mobility in the transistor channel 605.

It will be appreciated that different silicon precursors can be used in different cycles 140 (FIG. 9) or 380, 382, 384 (FIGS. 10A, 10B, 10C, respectively). For example, trisilane can be used as the silicon precursor for one cycle, and disilane can be used for another cycle. Preferably, trisilane is used to form the first silicon layer deposited on a substrate in the first performance of cycles 140 (FIG. 9) or 380, 382, 384 (FIGS. 10A, 10B, 10C, respectively). Subsequent silicon layers can be formed using halosilanes (i.e., silicon compounds having the chemical formula $R_{4-x}SiH_x$, where R=Cl, Br or I and X=0 to 3) or other silanes ($Si_nH_{2n+2}$ where n=1 to 4, with n≧2 preferred). It will also be appreciated that combinations of silicon precursors can be used, e.g., trisilane and disilane can be used simultaneously after forming the first silicon layer.

It will be further appreciated that the temperatures for different steps can be different. In one preferred embodiment in a single substrate reactor, a silicon layer formation 100 (FIG. 9) or exposure of a substrate to a silicon precursor 300, 310, 330 (FIGS. 10A, 10B, 10C, respectively) can occur at a first temperature that is less than about 525° C., preferably less than about 500° C., and most preferably less than about 475° C. Preferably, the layer is then allowed to stand for several seconds to allow for complete elimination of the hydrogen from the as-deposited silicon layer, prior to forming a silicon-containing compound layer 120 (FIG. 9) or exposing the substrate to other precursors (FIGS. 10A-10C). Preferably, the layer is allowed to stand for more than 10 seconds. For formation of the silicon-containing compound layer 120 (FIG. 9) or exposing the substrate to other reactive species, such as a reactive nitrogen species, the temperature is then increased to a second temperature that is higher than the first temperature. Preferably, subsequent cycles 140 (FIG. 9) or 380, 382, 384 (FIGS. 10A, 10B, 10C, respectively) are performed isothermally at this second higher temperature to deposited a silicon-containing compound layer of a desired thickness. Such a process is particularly useful for silicon nitride film deposition on non-crystalline silicon substrate surfaces (e.g., $SiO_2$, low dielectric constant spin on glass materials, metal oxides, metal silicates and metals), as the low temperature and hydrogen elimination period give a film with low hydrogen content at the interface with the substrate surface. Advantageously, the higher temperatures for subsequent deposition cycles allows for faster depositions and increased throughput after formation of the low hydrogen interface.

In addition, where the reaction chamber is a vertical batch reaction chamber, the precursor gases can be introduced in various ways. For example, all gases can be provided through the bottom of the vertical reactor and exhausted from the top, or vice versa. Optionally, the gases can be injected via gas injection tubes or multiple hole injectors (see FIGS. 3-5) to improve uniformity over the entire batch. In cases where trisilane is provided through such injectors, $N_2$ can also be provided through the same injectors, acting both as a carrier gas during trisilane pulses and as a reactant (whether remotely activated or activated in situ) during nitridation (or other reaction) pulses, and as a purge gas between the trisilane and the nitrogen pulses. Under the low temperatures of the preferred embodiments, ammonia can also be provided simultaneously or intermittently through the injector or through the bottom inlet. Preferably, however, if ammonia is provided, then activation of nitrogen is by remote MRG rather than in situ plasma activation, and the ammonia is provided directly to the process chamber rather than through the MRG. In addition, carbon precursor can be introduced at one end of the chamber and exhausted out of the other end, or can be injected into the chamber via injection tubes or multiple hole injectors (see FIGS. 3-5). The injection tubes or multiple hole injectors can be the same or different from that used to introduce the silicon precursor and/or the reactive nitrogen species.

It will also be appreciated that modifications to the batch reactor, or to the way of operating the batch reactor, known in the art, can be applied to improve the performance of this process. For example it is possible to use a holder boat or ring boat to improve the uniformity of film deposition over each wafer.

Deposited Silicon-Containing Compound Layers

Desirably, preferred silicon-containing compound films according to the preferred embodiments have a high tensile stress. Advantageously, a tensile stress of 2 GPa or greater can be achieved by doping a silicon nitride film with a carbon dopant. A tensile stress of that level allows the silicon nitride film to be used in transistor liner applications, as illustrated in FIG. 11. In addition, doping with carbon has been found to decrease the wet etch rate of the silicon nitride films. Thus, the carbon doped silicon nitride films can also advantageously be used as an etch stop barrier for wet etch processes.

In addition, the films have a thickness that is highly uniform across the surface of the film. Film thickness uniformity is preferably determined by making multiple-point thickness measurements, e.g., by ellipsometry or cross-sectioning, determining the mean thickness by averaging the various thickness measurements, and determining the rms variability. To enable comparisons over a given surface area, the results can be expressed as percent non-uniformity, calculated by dividing the rms thickness variability by the average thickness and multiplying by 100 to express the result as a percentage. Preferably, the thickness non-uniformity is about 20% or less, more preferably about 10% or less, even more preferably about 5% or less, most preferably about 2% or less.

In addition to thickness uniformity, preferred silicon-containing compound films preferably provide a conformal coating over varied topography. A conformal coating is a layer that follows the curvature, if any, of the structure that it overlies. The conformal silicon-containing compound films preferably exhibit good step coverage. "Step coverage" refers to the thickness uniformity of a conformal film that overlies a stepped surface. A stepped surface is a surface that has two or more parallel components that are not disposed in the same horizontal plane. Step coverage is preferably determined by measuring the average thickness of the film at the bottom of the step, dividing it by the average thickness at the top of the step, and multiplying by 100 to express the result in percentage terms.

The preferred silicon-containing compound films have good step coverage even at relatively high aspect ratios. "Aspect ratio" refers to the ratio of the vertical height of the step to the horizontal width of the structure. At an aspect ratio in the range of about 4.5 to about 6, preferred silicon-containing compound films have a step coverage of about 70% or greater, more preferably 80% or greater. At an aspect ratio in the range of about 1 to about 4, preferred silicon-containing compound films have a step coverage of about 80% or greater, more preferably 90% or greater. Step coverage is preferably calculated as stated above, but can also be calculated by taking into account sidewall thicknesses. For example, alternate definitions of step coverage involve the ratio of the sidewall thickness to the average thickness at the top and/or bottom of the step. However, unless otherwise stated, step coverage herein is determined as stated above by measuring the average thickness of the horizontal portions of the silicon-containing compound film at the bottom of the step, dividing it by the average thickness of the horizontal portions at the top of the step, and multiplying by 100 to express the result in percentages.

Advantageously, surface smoothness and thickness of the preferred silicon-containing compound films are maintained over a surface area of about one square micron ($\mu m^2$) or greater, more preferably about 5 $\mu m^2$ or greater, even more preferably about 10 $\mu m$ or greater. The silicon-containing compound film can cover all or part of a large substrate, e.g., a wafer, and thus can have a surface area of about 300 $cm^2$ or greater, preferably about 700 $cm^2$ or greater.

EXAMPLE

A carbon doped silicon nitride layer is formed in a batch A412™ reactor from ASM International N.V. of Bilthoven, The Netherlands. For this purpose, a batch of 50 wafers having a diameter of 200 mm is loaded into a wafer boat. The wafer boat is preferably provided with rings which surrounded the edges of the wafers to improve uniformity of the deposited film at those edges. The temperature of the wafers is allowed to stabilize such that the temperature across each wafer is uniform at between about 300° C. and about 500° C., more preferably, each wafer is at a temperature of about 435° C. The boat is preferably rotated about a vertical axis within the reaction chamber. The pressure is preferably set to between about 100 mTorr and about 10 Torr. Trisilane diluted with inert gas is flowed into the reaction chamber at a flow of 20 sccm concurrently with a flow of mono-methyl silane of about 20 sccm, the trisilane partial pressure preferably being 4 mTorr and the exposure time being 5 minutes. During this time a carbon doped silicon film of about 5 Å thick will be deposited. The trisilane flow and mono-methyl silane flow is then interrupted. Nitridation is then performed by providing 5 slm $N_2$ to the reaction chamber for 4 minutes. During that time, the $N_2$ is intermittently activated in four cycles of 30 seconds on 30 seconds off using a power of 3000 Watts.

It will be appreciated by those skilled in the art that various omissions, additions and modifications can be made to the processes described above without departing from the scope of the invention, and all such modifications and changes are intended to fall within the scope of the invention, as defined by the appended claims.

We claim:

1. A method of forming a silicon-containing compound layer, comprising:

loading a substrate into a reactor;

depositing a carbon-doped silicon layer on the substrate by exposing the substrate to a flow of a mixture containing trisilane and a dopant precursor, wherein the dopant precursor is an alkylsilane;

interrupting the flow of the mixture; and forming an insulating silicon compound layer by exposing the silicon layer to a reactive nitrogen species while interrupting the flow of the mixture.

2. The method of claim 1, wherein the dopant precursor is chosen from the group consisting of mono-methyl silane, di-methyl silane, tri-methyl silane, tetra-methyl silane, mono-methyl disilane, di-methyl disilane, tri-methyl disilane, tetra-methyl disilane, mono-methyl trisilane, di-methyl trisilane, tri-methyl trisilane, and tetra-methyl trisilane.

3. The method of claim 2, further comprising selecting the dopant precursor based upon a desired silicon-containing compound layer dopant concentration, wherein relatively high carbon content species are selected for relatively high desired dopant concentrations and relatively low carbon content species are selected for relatively low desired dopant concentrations.

4. The method of claim 1, wherein depositing the silicon layer, interrupting the flow of the mixture and forming the silicon compound layer comprises repeatedly sequentially flowing the mixture and the reactive nitrogen species into the chamber.

5. The method of claim 1, wherein exposing the silicon layer to a reactive nitrogen species comprises exposing the silicon layer to nitrogen radicals.

6. The method of claim 5, wherein exposing the silicon layer to nitrogen radicals comprises remotely activating nitrogen gas, and wherein exposing the silicon layer to a reactive nitrogen species further comprises exposing the silicon layer to ammonia.

7. The method of claim 1, wherein exposing the silicon layer to a reactive nitrogen species comprises exposing the silicon layer to ammonia.

8. The method of claim 1, wherein the reactive nitrogen species is a remotely generated excited nitrogen species.

9. The method of claim 1, wherein the reactor is a furnace configured to accommodate a plurality of substrates.

10. The method of claim 9, wherein depositing a silicon layer is performed under reaction kinetics limited conditions.

11. The method of claim 9, wherein depositing a silicon layer, interrupting the flow of the mixture and forming the silicon compound layer comprises accommodating each of the plurality of substrates in the furnace vertically spaced from one another with major surfaces of the substrate extending horizontally.

12. The method of claim 1, wherein depositing the silicon layer, interrupting the flow of the mixture and forming the silicon compound layer comprises maintaining the substrate at a temperature between about 250° C. and about 600° C.

13. The method of claim 12, wherein the temperature is between about 300° C. and about 500° C.

14. The method of claim 1, wherein exposing the substrate to a flow of the mixture and comprises flowing trisilane to the reactor at a rate less than about 400.1 mg/minute.

* * * * *

UNITED STATES PATENT AND TRADEMARK OFFICE
CERTIFICATE OF CORRECTION

PATENT NO. : 7,629,267 B2
APPLICATION NO. : 11/370228
DATED : December 8, 2009
INVENTOR(S) : Yuet Mei Wan, René de Blank and Jan Willem Maes It is certified that error appears in the above-identified patent and that said Letters Patent is hereby corrected as shown below:

On the title page, item [56]:

On page 1, Col. 2, line 15, under "Other Publications", please change "hetrostructures" to --heterostructures--.

On page 2, Col. 2, line 65, under "Other Publications", please change "amorphouse" to --amorphous--.

In Col. 22, line 35, please change "10 μm" to --10 $\mu m^2$--.

Signed and Sealed this

Eighteenth Day of May, 2010

David J. Kappos
*Director of the United States Patent and Trademark Office*

UNITED STATES PATENT AND TRADEMARK OFFICE
CERTIFICATE OF CORRECTION

PATENT NO.       : 7,629,267 B2                                    Page 1 of 1
APPLICATION NO. : 11/370228
DATED            : December 8, 2009
INVENTOR(S)      : Wan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 575 days.

Signed and Sealed this

Second Day of November, 2010

David J. Kappos
*Director of the United States Patent and Trademark Office*